(12) United States Patent
Oda et al.

(10) Patent No.: US 10,983,610 B2
(45) Date of Patent: Apr. 20, 2021

(54) ELECTRONIC PEN AND COORDINATE INPUT APPARATUS

(71) Applicant: Wacom Co., Ltd., Saitama (JP)

(72) Inventors: Yasuo Oda, Saitama (JP); Hideyuki Hara, Tokyo (JP)

(73) Assignee: Wacom Co., Ltd., Saitama (JP)

( * ) Notice: Subject to any disclaimer, the term of this patent is extended or adjusted under 35 U.S.C. 154(b) by 94 days.

(21) Appl. No.: 16/243,907

(22) Filed: Jan. 9, 2019

(65) Prior Publication Data

US 2019/0146603 A1 May 16, 2019

Related U.S. Application Data

(63) Continuation of application No. PCT/JP2017/025883, filed on Jul. 18, 2017.

(30) Foreign Application Priority Data

Jul. 22, 2016 (JP) .............................. JP2016-144439

(51) Int. Cl.
*G06F 3/0354* (2013.01)
*H03K 17/96* (2006.01)
*G06F 3/046* (2006.01)

(52) U.S. Cl.
CPC .......... *G06F 3/03545* (2013.01); *G06F 3/046* (2013.01); *H03K 17/96* (2013.01)

(58) Field of Classification Search
CPC ...... G06F 3/03545; G06F 3/046; H03K 17/96
See application file for complete search history.

(56) References Cited

U.S. PATENT DOCUMENTS

| 9,483,129 | B1* | 11/2016 | Holsen | G06F 3/03545 |
| 2012/0256830 | A1* | 10/2012 | Oda | G06F 3/03545 345/157 |
| 2014/0218338 | A1* | 8/2014 | Kim | G06F 3/046 345/174 |
| 2014/0240298 | A1* | 8/2014 | Stern | G06F 3/0383 345/179 |
| 2015/0309599 | A1* | 10/2015 | Michihata | G06F 1/3259 345/174 |

(Continued)

FOREIGN PATENT DOCUMENTS

| JP | 5-313809 A | 11/1993 |
| JP | 7-500435 A | 1/1995 |

(Continued)

*Primary Examiner* — Lixi C Simpson
(74) *Attorney, Agent, or Firm* — Seed IP Law Group LLP

(57) ABSTRACT

An electronic pen includes a conductive core-side member, a power supply circuit, a signal transmission circuit which, in operation, receives a power supply voltage from the power supply circuit, generates a first signal and a second signal each having a different waveform, and selectively supplies either the first signal or the second signal to the core-side member, an input reception circuit which, in operation, receives a designation input designating either the first signal or the second signal to be supplied from the signal transmission circuit to the core-side member, and a control circuit which, in operation, controls the signal transmission circuit to supply either the first signal or the second signal to the core-side member according to the designation input received by the input reception circuit.

12 Claims, 15 Drawing Sheets

(56) References Cited

U.S. PATENT DOCUMENTS

2015/0363012 A1\* 12/2015 Sundara-Rajan ... G06F 3/03545
    345/179
2017/0228050 A1\* 8/2017 Lin ..................... G06F 3/03545

FOREIGN PATENT DOCUMENTS

| JP | 7-104908 A | 4/1995 |
|----|------------|--------|
| JP | 5687398 B1 | 3/2015 |
| JP | 2016095833 A | 5/2016 |

\* cited by examiner

ELECTRONIC PEN AND COORDINATE INPUT APPARATUS

BACKGROUND

1. Technical Field

The present disclosure relates to an electronic pen of the so-called active capacitive coupling system that is used in conjunction with a tablet and transmits signals to the tablet. The disclosure also relates to a coordinate input apparatus made up of a tablet and an active capacitive coupling type of electronic pen.

2. Description of the Related Art

Diverse types of electronic pens (stylus pen) for use with tablets have been proposed, including an electronic induction type of electronic pen and a capacitive coupling type of electronic pen. Of these types of electronic pens, ones operating by active capacitive coupling have recently appeared. The active capacitive coupling type of electronic pen incorporates a power supply part that uses a primary or a secondary battery and a signal transmission part. This electronic pen further has a core body formed by a conductor and outputs via the conductive core body a signal coming from the signal transmission part to the tablet by capacitive coupling (e.g., see Patent Literature 1 "Japanese Patent No. 5687398").

The signal output from the active capacitive coupling type of electronic pen has a large amplitude of 15 volts or more, for example. This allows the tablet to detect with high resolution the position indicated by the electronic pen.

The active capacitive coupling type of electronic pen uses the primary battery or a rechargeable secondary battery as its power supply, and there may be diverse waveforms in which the signal is transmitted by the electronic pen. Typically, the waveforms may be sine waves and rectangular waves. In the case of an electronic pen that uses a sine wave signal as its transmission signal, a resonance capacitor of an internal resonance circuit absorbs the effects of stray capacitance. This minimizes power loss and prolongs battery life. However, the use of a transformer is preferred, which incurs the disadvantage of making the circuit configuration relatively complicated.

Meanwhile, in the case of an electronic pen that uses a rectangular wave signal as its transmission signal, there is an advantage of a signal generation circuit being configured simply as long as a digital signal supplied from the electronic pen to the tablet is a binary signal. The disadvantage, on the other hand, is an increasing power loss caused by stray capacitance leading to shorter battery life. Incidentally, in order to generate the rectangular wave signal of a large amplitude from the battery voltage with the simplified configuration, there may be used a circuit that includes a transformer for boosting purposes.

As described above, there are advantages and disadvantages as to which of the sine wave signal and the rectangular wave signal is to be used as the signal transmitted from the active capacitive coupling type of electronic pen. As a result, what is expected is the marketing and coexistence of the two types of active capacitive coupling type of electronic pens: one using the sine wave signal as the transmission signal and the other using the rectangular wave signal as the transmission signal. What is also expected is the coexistence of two types of tablets: one that receives the sine wave signal from the electronic pen for position detection and other signal processing, and the other that receives the rectangular wave signal from the electronic pen also for position detection and other signal processing.

Given the circumstances, users have to change electronic pens depending on tablet type, i.e., whether the tablet receives the sine wave signal or the rectangular wave signal from the electronic pen. The changing of the electronic pens is troublesome and economically inefficient.

BRIEF SUMMARY

An object of the present disclosure is to provide an electronic pen that solves the above problems.

In solving the above problems, there is provided an electronic pen including: a conductive core-side member; a power supply circuit; a signal transmission circuit which, in operation, receives a power supply voltage from the power supply circuit, generates a first signal and a second signal each having a different waveform, and selectively supplies either the first signal or the second signal to the core-side member; an input reception which, in operation, receives a designation input designating either the first signal or the second signal to be supplied from the signal transmission circuit to the core-side member; and a control which, in operation, controls the signal transmission circuit to supply either the first signal or the second signal to the core-side member according to the designation input received by the input reception circuit.

The electronic pen of the above-described configuration supports both a tablet adapted to the first signal and a tablet adapted to the second signal. The electronic pen thus provides a significant advantage of being both convenient and economical because there is no need to prepare an electronic pen for each tablet and because the electronic pen can be shared with the different tablets.

Preferably, the signal transmission circuit may include a sine wave signal generation which, in operation, generates a sine wave signal as the first signal. The sine wave signal generation circuit may include a transformer of which the primary winding side is connected with a capacitor to constitute a resonance circuit, the secondary winding side of the transformer outputting the sine wave signal. The secondary winding side of the transformer may have a rectifier circuit of which the output voltage is used as the power supply voltage for the signal generation circuit that generates the second signal.

The electronic pen of the preferred configuration described above supports both a tablet adapted to the sine wave signal as the first signal and a tablet adapted to the second signal of a different waveform. The sine wave signal generation circuit generating the sine wave signal has the transformer of which the primary winding side is connected with the capacitor to constitute the resonance circuit, the secondary winding side of the transformer outputting the sine wave signal. The sine wave signal generation circuit thus generates the sine wave signal boosted by the transformer. Also, the rectifier circuit provided on the secondary winding side of the transformer generates the power supply voltage for the signal generation circuit that generates the second signal. The electronic pen thus provides a significant advantage of a simplified configuration furnished with only one transformer because there is no need to prepare a dedicated transformer to generate a high supply voltage for the signal generation circuit for generating the second signal.

DETAILED DESCRIPTION OF THE PREFERRED EMBODIMENTS

First Embodiment

Described below are an electronic pen and a coordinate input apparatus in a first embodiment of the present disclosure. First of all, outlines of the electronic pen and the coordinate input apparatus in the first embodiment of the disclosure are explained with reference to FIG. 1. For the first embodiment to be described below, it is assumed that a first signal and a second signal of different waveforms are output from the electronic pen 1 and that the first signal is a sine wave signal and the second signal is a rectangular wave signal.

For the embodiment to be described below, it is also assumed that the sine wave signal as the first signal and the rectangular wave signal as the second signal are different from each other not only in waveform but also in frequency and in amplitude. For example, the sine wave signal has a frequency of 1.8 MHz and an amplitude of 17 volts; the rectangular wave signal has a frequency of tens of kHz and an amplitude of 20 volts. In the electronic pen 1 of the first embodiment, a conductive core 11 is provided as a core-side member through which signals are exchanged with a tablet.

Figure 1:
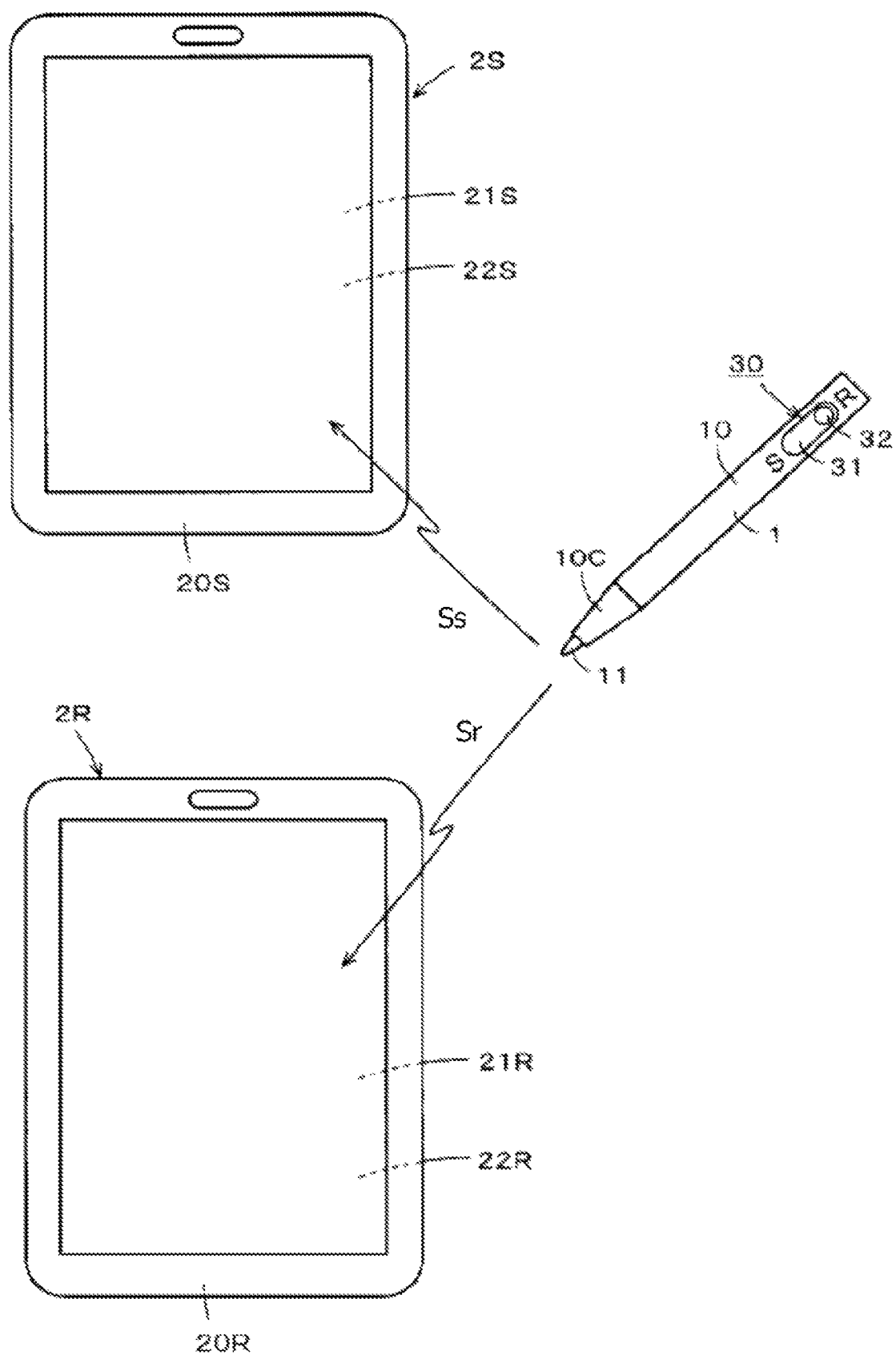
FIG. 1 is a schematic diagram explaining an outline of a coordinate input apparatus in a first embodiment of the present disclosure.

The electronic pen 1 of this embodiment, together with the tablet, constitutes the coordinate input apparatus. In this embodiment, as depicted in FIG. 1, there are two types of tablets: a first type of tablet 2S (called a sine wave type of tablet hereunder) that receives a sine wave signal Ss sent from the electronic pen 1 to detect the position indicated by the electronic pen 1, and a second type of tablet 2R (called a rectangular wave type of tablet hereunder) that receives a rectangular signal Sr transmitted from the electronic 1 to detect the position indicated by the electronic pen 1.

Also, the electronic pen 1 of this embodiment is configured to have a sine wave mode in which the sine wave signal Ss is generated as the transmission signal and a rectangular wave mode in which the rectangular wave signal Sr is generated as the transmission signal, the two modes being switched depending on the tablet 2S or the tablet 2R being in use.

In this embodiment, the tablets 2S and 2R have housings 20S and 20R that respectively accommodate position detection sensors 21S and 21R exchanging signals with the electronic pen 1 by capacitive coupling. Also provided are pen indication detection circuits 22S and 22R that are connected respectively with the position detection sensors 21S and 21R and perform signal processing.

In this case, the position detection sensors 21S and 21R have the same configuration. However, the pen indication detection circuits 22S and 22R are different from each other in configuration. That is, the pen indication detection circuit 22S is configured to receive the sine wave signal Ss from the electronic pen 1 to perform a position detection process and other processes, and the pen indication detection circuit 22R is configured to receive the rectangular wave signal Sr from the electronic pen 1 to carry out the position detection process and other processes.

The electronic pen 1 of this embodiment has a slide operation switch 30 as an example of a mode switching operation section. The slide operation switch 30 constitutes an input reception circuit. In this example, as depicted in FIG. 1, the slide operation switch 30 has a character "S" printed or engraved, for example, at one end of an elongated hole 31 in the axial direction of a housing 10 and a character "R" printed or engraved, for example, at the other end of the elongated hole 31.

When a slide operation button 32 of the slide operation switch 30 in this example is at the "S" end of the elongated hole 31, a low-level state indicative of the sine wave mode is brought about, for example. When the slide operation button 32 is at the "R" end of the elongated hole 31, a mode designation signal SE (see FIG. 2, to be discussed later) producing a high-level state indicative of the rectangular wave mode is generated, for example.

The user performs a switching operation of the slide operation switch 30 in a manner depending on whether the tablet in use is the sine wave type of tablet 2S or the rectangular wave type of tablet 2R. The electronic pen 1 is then brought into the mode reflecting the switching operation, outputting either the sine wave signal Ss or the rectangular wave signal Sr via the core 11. Incidentally, the electronic pen 1 may output the sine wave signal Ss or the rectangular wave signal Sr via a cone-shaped cover 10C covering the core 11.

The tablet 2S or 2R receives, depending on its type, either the sine wave signal Ss or the rectangular wave signal Sr from the electronic pen 1. Given the signal, the tablet 2S or 2R proceeds to perform the processes of detecting the position indicated by the electronic pen, detecting writing pressure information, and detecting identification information identifying the electronic pen 1, and to process other additional information.

In the manner described above, the electronic pen 1 of this embodiment can be used to indicate positions on both the tablet 2S and the tablet 2R.

Incidentally, the mode switching operation section is not limited structurally to the slide operation switch 30. Alternatively, the mode switching operation section may be a seesaw type selector switch, or a pair of pushbutton switches representing the sine wave mode and the rectangular wave mode, for example. As another alternative, switching may be performed between the sine wave mode and the rectangular wave mode every time one pushbutton switch is pressed. As a further alternative, a signal output from the tablet 2S or 2R may be used to switch between the sine wave mode and the rectangular wave mode. Example of an electrical configuration of the electronic pen 1

The electronic pen 1 of this embodiment is configured simply to generate signals of the above-mentioned two different waveforms. Thus, one feature of the electronic pen 1 of this embodiment is that the simply configured electronic pen 1 outputs signals of two different waveforms without becoming larger in size.

Figure 2:
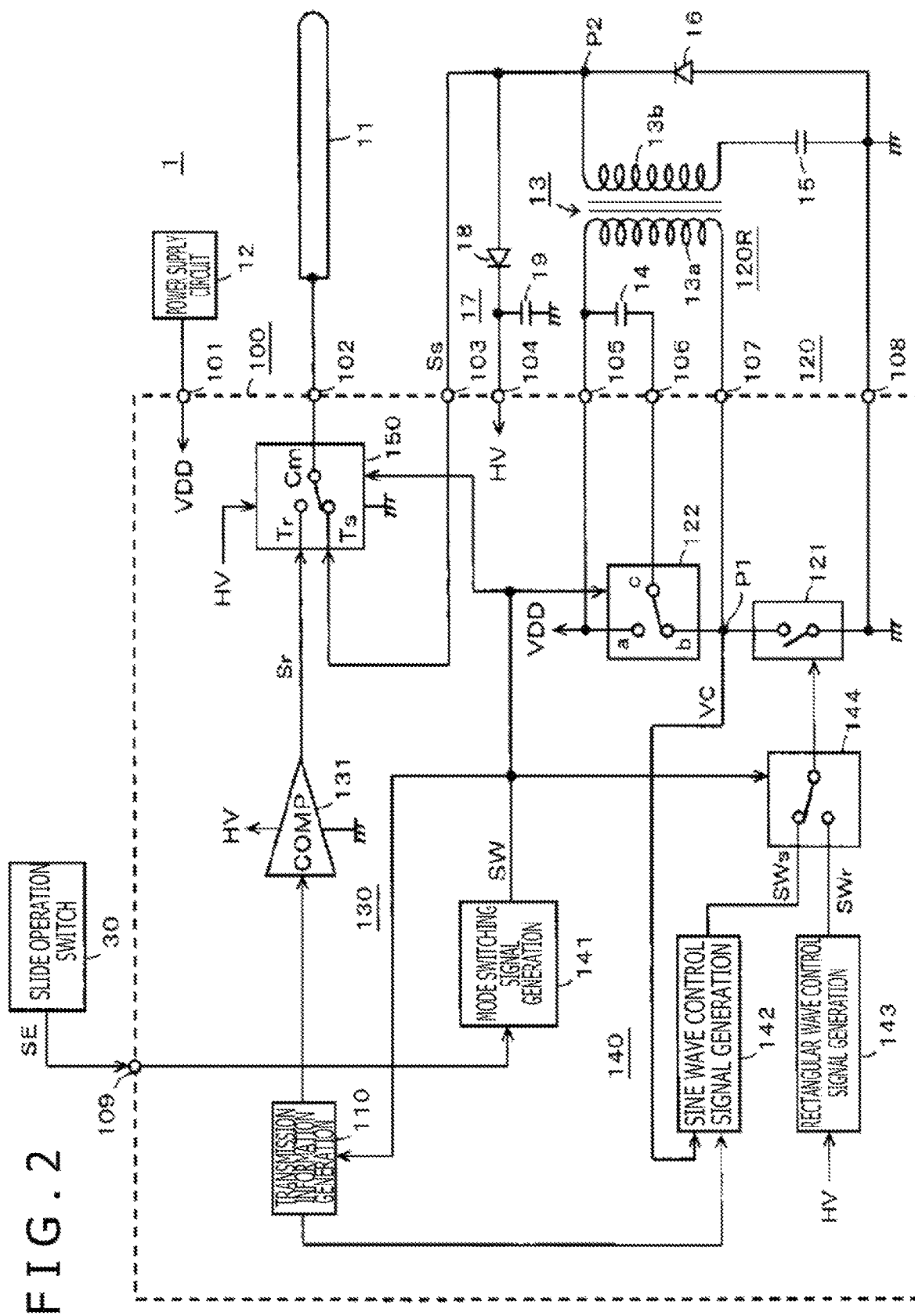
FIG. 2 is a block diagram depicting an example of an electrical configuration of an electronic pen in the first embodiment of the present disclosure.

FIG. 2 depicts a representative signal processing circuit as an example of an electrical configuration of the electronic pen 1 in the first embodiment. The electronic pen 1 of this embodiment includes the conductive core 11 through which to transmit the sine wave signal Ss or the rectangular wave signal Sr. The core 11 is configured with a conductive metal, for example.

Also, the electronic pen 1 of this embodiment has a power supply voltage VDD generated by a power supply circuit 12 that includes a primary or a secondary battery. For example, a lithium ion battery is used as the secondary battery. The power supply circuit 12 may be configured with an electrical storage element such as an electric double layer capacitor or a lithium ion capacitor in place of, or in combination with the secondary battery. The power supply circuit 12 may alternatively be configured with an autonomous power generation element such as a solar cell, as well as the electrical storage element such as an electric double layer capacitor or a lithium ion capacitor.

The signal processing circuit of the electronic pen 1 in this embodiment is configured with an integrated circuit (IC) 100 and its external components. The IC 100 has terminals 101 to 109. The power supply voltage VDD from the power supply circuit 12 is supplied to the IC 100 via the terminal 101.

The signal processing circuit configured with the IC 100 and its external components includes a transmission information generation circuit 110, a sine wave signal generation circuit 120 that generates the sine wave signal Ss as the typical first signal, a rectangular wave signal generation circuit 130 that generates the rectangular wave signal Sr as the typical second signal, a control circuit 140, a mode switching circuit 150, and a rectifier circuit 17.

The mode switching circuit 150 includes a sine wave mode terminal Ts, a rectangular wave mode terminal Tr, and a common terminal Cm. A mode switching signal SW from a mode switching signal generation circuit 141, to be discussed later, in the control circuit 140 causes the mode switching circuit 150 to connect the common terminal Cm with either the sine wave mode terminal Ts or the rectangular wave mode terminal Tr.

The common terminal Cm of the mode switching circuit 150 is connected with the conductive core 11 of the electronic pen 1 via the terminal 102 of the IC 100. The mode switching circuit 150 is configured to have its sine wave mode terminal Ts supplied with the sine wave signal Ss from the sine wave signal generation circuit 120 via the terminal 103 of the IC 100. The mode switching circuit 150 is also configured to have its rectangular wave mode terminal Tr supplied with the rectangular wave signal Sr from the rectangular wave signal generation circuit 130.

The control circuit 140 in this embodiment is configured with a mode switching signal generation circuit 141, a sine wave control signal generation circuit 142, a rectangular wave control signal generation circuit 143, and a selector switch circuit 144.

The mode switching signal generation circuit 141 receives input of the mode designation signal SE from the slide operation switch 30 via the terminal 109 of the IC 100. On the basis of the input mode designation signal SE, the mode switching signal generation circuit 141 determines whether the sine wave mode or the rectangular wave mode is to be selected as the transmission mode of the electronic pen 1. In accordance with the result of the determination, the mode switching signal generation circuit 141 generates the mode switching signal SW. The mode switching signal generation circuit 141 then supplies the generated mode switching signal SW to the transmission information generation circuit 110, to a selector switch circuit 122, to be discussed later, of the sine wave signal generation circuit 120, to the selector switch circuit 144 of the control circuit 140, and to the mode switching circuit 150.

Receiving the mode switching signal SW from the mode switching signal generation circuit 141, the transmission information generation circuit 110 generates transmission information to be sent to the tablet 2S or 2R. In accordance with the mode switching signal SW, the signal corresponding to the transmission information generated by the transmission information generation circuit 110 is controlled to differ between the sine wave mode and the rectangular wave mode. However, the content of the transmission information is the same for both the sine wave mode and the rectangular wave mode.

In the sine wave mode, the transmission information generation circuit 110 supplies the signal for the sine wave mode to the sine wave control signal generation circuit 142 in the control circuit 140. In the rectangular wave mode, the transmission information generation circuit 110 supplies the signal for the rectangular wave mode to the rectangular wave signal generation circuit 130.

The transmission information includes, in addition to the signal for position detection, information signals that represent information regarding the writing pressure detected by a writing pressure detection mechanism (not illustrated) included in the electronic pen 1, on-off information regarding a side switch (not illustrated) attached to the electronic pen 1, and identification information stored in a memory (not illustrated) to identify the electronic pen 1.

The sine wave signal generation circuit 120 is configured with a transformer 13, a resonance capacitor 14, a bias generation capacitor 15, and a backflow prevention diode 16 as external components, as well as a switch circuit 121 and the selector switch circuit 122 inside the IC 100. In the electronic pen 1 of this embodiment, the transformer 13 is used not only to generate the sine wave signal but also to produce a high power supply voltage for generating the rectangular wave signal.

As described above, the signal output from the electronic pen 1 of this embodiment to the tablet 2S or 2R is a large-amplitude signal of 17 or 20 volts, for example. On the other hand, the power supply voltage VDD from the power supply circuit 12 that uses the primary or the secondary battery is a low voltage. For this reason, the transformer 13 is used not only to generate the sine wave signal Ss but also to perform the process of boosting the sine wave signal Ss for larger amplitude.

Because the rectangular wave signal Sr is also a large-amplitude signal, it is necessary to generate a high voltage from the power supply voltage VDD, and accordingly, the boosting is generally accomplished using a transformer. However, if the transformer 13 for generating the sine wave signal and for boosting the voltage is supplemented with a separate transformer for generating the high voltage for the rectangular wave signal, that means two transformers coexist in the electronic pen 1. This can increase the size of the electronic pen 1, making it difficult to manufacture a slender electronic pen 1. In order to solve this problem, the first embodiment is configured to use the transformer 13 not only to generate the sine wave signal but also to produce the high voltage for generating the rectangular wave signal.

The transformer 13 has a primary winding 13a and a secondary winding 13b. A turn ratio of the primary winding 13a to the secondary winding 13b is 1:n (n>1 where n=5, for example). One end of the primary winding 13a of the transformer 13 is connected with one end of the resonance capacitor 14 that constitutes, together with the primary winding 13a, a resonance circuit. The one end of the primary winding 13a is also connected with the terminal 105 of the IC 100 where the power supply voltage VDD is obtained. The other end of the primary winding 13a of the transformer 13 is connected, via the terminal 107, with one end of the switch circuit 121 and with a connection point P1 for the other switching terminal b of the selector switch circuit 122.

The other end of the resonance capacitor 14 is connected with a common terminal c of the selector switch circuit 122 via the terminal 106 of the IC 100. One switching terminal a of the selector switch circuit 122 is connected with the terminal 101 where the power supply voltage VDD is obtained. The other switching terminal b of the selector switch circuit 122 is connected with one end of the switch circuit 121. The other end of the selector switch circuit 121 is connected with the terminal 108 that is grounded.

In this embodiment, an oscillation circuit 120R is configured with a resonance circuit formed by the primary winding 13a of the transformer 13 and by the resonance capacitor 14 and with a circuit that includes the switch circuit 121. In the sine wave mode, the oscillation circuit 120R performs an oscillation operation using the resonance circuit made up of the primary winding 13a of the transformer 13 and the resonance capacitor 14. At an appropriate timing, the switch circuit 121 is controlled to be turned on and off to energize the oscillation circuit 120R. This makes it possible to continue the oscillation of the oscillation circuit 120R without attenuating its oscillation output signal (i.e., sine wave signal).

Also in this embodiment, the switch circuit 121 in the rectangular wave mode is controlled to be turned on and off to generate a power supply voltage (high voltage HV (=HVr)) corresponding to the amplitude of the rectangular wave signal to be generated, using the transformer 13 as a flyback type step-up transformer. That is, in this embodiment, not only the transformer 13 but also the switch circuit 121 is used in both the sine wave mode and the rectangular wave mode.

It is to be noted, however, that the switch circuit in this embodiment is controlled to be turned on and off differently between the sine wave mode and the rectangular wave mode. Thus, as depicted in FIG. 2, the selector switch circuit 144 is provided along with the sine wave control signal generation circuit 142 and the rectangular wave control signal generation circuit 143 so as to partially make up the control circuit 140.

The selector switch circuit 122 is provided to switch between two types of configurations. In the sine wave mode, the selector switch circuit 122 connects the resonance capacitor 14 in parallel with the primary winding 13a of the transformer 13 to configure the resonance circuit. In the rectangular wave mode, the selector switch circuit 122 disconnects the parallel connection between the resonance capacitor 14 and the primary winding 13a of the transformer 13 so as not to configure the resonance circuit. The mode switching signal SW from the mode switching signal generation circuit 141 causes the selector switch circuit 122 to connect the common terminal c with the switching terminal b in the sine wave mode, and connect the common terminal c with the switching terminal a in the rectangular wave mode.

By monitoring the voltage VC obtained at the connection point P1, the sine wave control signal generation circuit 142 generates a sine wave control signal to turn on and off the switch circuit 121 causing the oscillation circuit 120R to generate the sine wave signal Ss. The rectangular wave control signal generation circuit 143 generates a rectangular wave control signal to turn on and off the switch circuit 121 causing the rectifier circuit 17 to produce a high voltage HV (HVr) necessary for generating the rectangular wave signal Sr.

The switch circuit 121 is configured to be selectively supplied, via the selector switch circuit 144, with the sine wave control signal from the sine wave control signal generation circuit 142 and with the rectangular wave control signal from the rectangular wave control signal generation circuit 143.

The mode switching signal SW from the mode switching signal generation circuit 141 switches the selector switch circuit 144 to the side of the sine wave control signal generation circuit 142 in the sine wave mode or to the side of the rectangular wave control signal generation circuit 143 in the rectangular wave mode. Processing operations performed by the sine wave control signal generation circuit 142 and by the rectangular wave control signal generation circuit 143 will be discussed later in detail.

One end of the secondary winding 13b of the transformer 13 is connected with the cathode of the diode 16 for bias generation. The anode of the diode 16 is both grounded and connected with the terminal 108 of the IC 100. The other end of the secondary winding 13b of the transformer 13 is both grounded via the bias generation capacitor 15 and connected with the terminal 108 of the IC 100.

A connection point P2 between the one end of the secondary winding 13b of the transformer 13 and the cathode of the diode 16 is connected with the terminal 103 of the IC 100. A signal obtained at the connection point P2 is supplied into the IC 100 via the terminal 103. The signal brought into the IC 100 via the terminal 103 is supplied to the sine wave mode terminal Ts of the mode switching circuit 150.

The connection point P2 is also connected with the rectifier circuit 17 formed by a rectifier diode 18 and a capacitor 19. An output terminal of the rectifier circuit 17 is connected with the terminal 104 of the IC 100. The rectifier circuit 17 rectifies the signal obtained at the connection point P2 at the one end of the secondary winding 13b of the transformer 13, thereby generating the high voltage HV boosted in accordance with the turn ratio of the primary winding 13a to the secondary winding 13b in the transformer 13.

That is, in the sine wave mode, the rectifier circuit 17 rectifies the sine wave signal Ss obtained at the connection point P2 at the one end of the secondary winding 13b of the transformer 13, thereby generating the high voltage HV (=HVs) corresponding to the amplitude of this sine wave signal Ss. The high voltage HV (=HVs) in the sine wave mode is used as the power supply voltage for the mode switching circuit 150.

In the rectangular wave mode, the rectifier circuit 17 rectifies, by the flyback method to be discussed later, the signal obtained at the connection point P2 at the one end of the secondary winding 13b, thus generating the high voltage HV (=HVr) necessary for generating the rectangular wave signal Sr. The high voltage HV (=HVr) in the rectangular wave mode is used as the power supply voltage for both the rectangular wave signal generation circuit 130 and the mode switching circuit 150.

The rectangular wave signal generation circuit 130 in this embodiment is configured with a level conversion circuit 131 for rectangular wave signal generation. The power supply voltage for the level conversion circuit 131 is the high voltage HV (HVr) generated by the rectifier circuit 17. The rectangular wave signal generation circuit 130 will be discussed later in detail.

Described below are the processing operations performed by the sine wave control signal generation circuit 142 in the mode for sine wave signal generation and by the rectangular wave control signal generation circuit 143 in the rectangular wave mode in the signal processing circuit of the electronic pen 1 configured as described above.

Processing Operations by the Sine Wave Control Signal Generation Circuit 142

Figure 3:
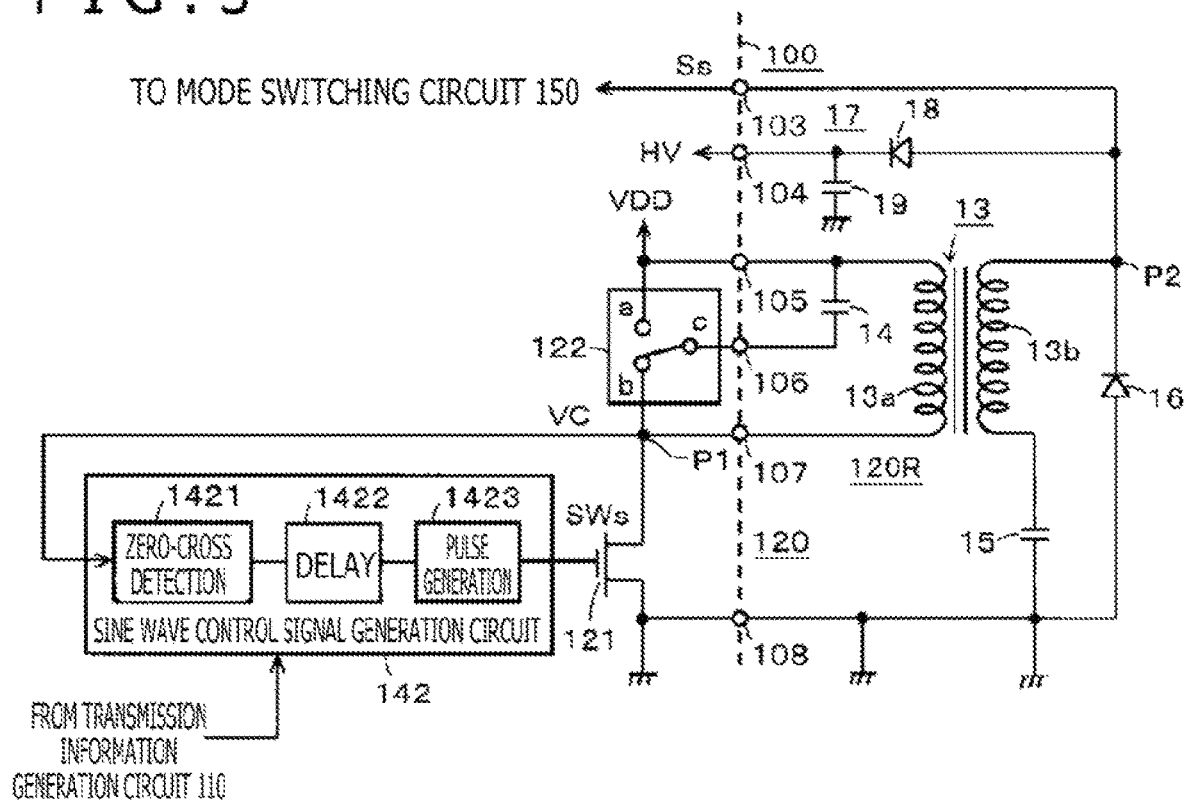
FIG. 3 is an explanatory diagram explaining a sine wave mode of the electronic pen in the first embodiment of the present disclosure.
Figure 4:
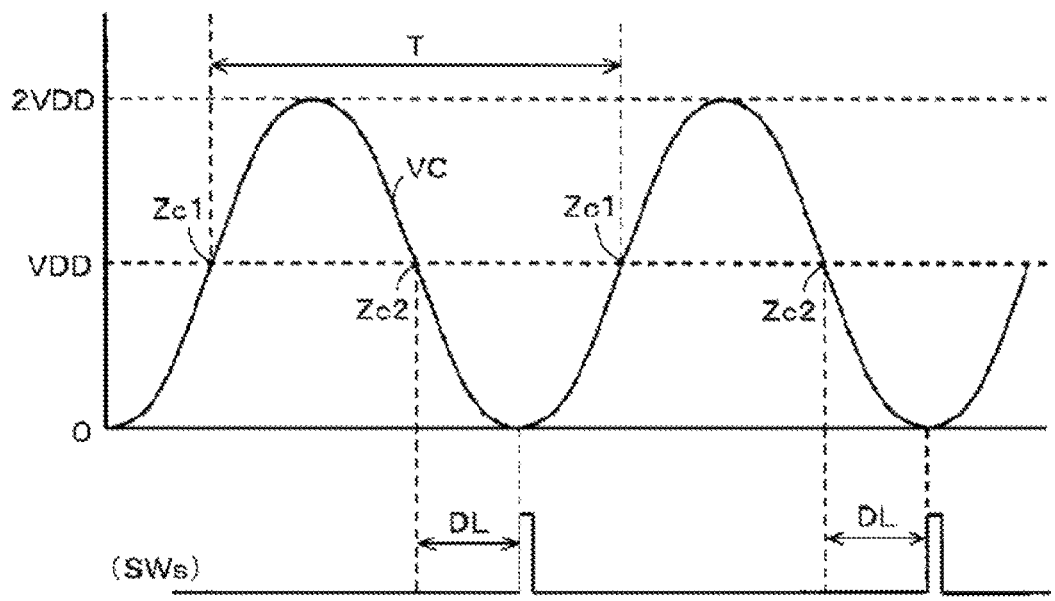
FIG. 4 is an explanatory diagram explaining the sine wave mode of the electronic pen in the first embodiment of the present disclosure.

FIG. 3 is an explanatory diagram explaining a specific circuit example of the sine wave control signal generation circuit 142 as well as the processing operations performed by the sine wave control signal generation circuit 142 in the sine wave mode. FIG. 4 is another explanatory diagram explaining the processing operations carried out by the sine wave control signal generation circuit 142.

In the circuit example of FIG. 3, the switch circuit 121 is configured with one field-effect transistor (FET). In the illustration, the selector switch circuit 122 is in a switching state for the sine wave mode, with the common terminal c set to the switching terminal b to constitute the oscillation circuit 120R that includes an LC resonance circuit formed by the primary winding 13a of the transformer 13 and by the resonance capacitor 14. Note that, in FIG. 3, the switch circuit 144 is omitted for the purpose of simplification.

The sine wave control signal generation circuit 142 of this example includes a zero-cross detection circuit 1421, a delay circuit 1422, and a pulse generation circuit 1423.

The oscillation circuit 120R including the LC resonance circuit made up of the primary winding 13a of the transformer 13 and the resonance capacitor 14 causes a sine wave voltage VC to be obtained at the connection point P1, the sine wave voltage VC having a frequency of 1.8 MHz and an amplitude of 2 VDD for example, as illustrated in the upper portion of FIG. 4. The sine wave voltage VC obtained at the connection point P1 is used as an input signal to the zero-cross detection circuit 1421.

The zero-cross detection circuit 1421 detects zero-cross points of the sine wave voltage VC behaving as a sine wave, i.e., time points Zc1 and Zc2 (see upper portion of FIG. 4) at which the sine wave voltage VC crosses the voltage value VDD. Given the detected zero-cross points Zc1 and Zc2, the zero-cross detection circuit 1421 supplies the delay circuit 1422 with the zero-cross point Zc2 at which the transition occurs from high to low voltage in the form of a signal such as a pulse indicative of the point Zc2.

Base on the signal from the zero-cross detection circuit 1421, the delay circuit 1422 supplies the pulse generation circuit 1423 with a signal such as a pulse signal indicative of a time point delayed from the zero-cross point Zc2 by a delay time DL corresponding to ¼ of one cycle T of the sine wave voltage VC. Based on the signal from the delay circuit 1422, the pulse generation circuit 1423 generates a switching signal SWs of a predetermined pulse width (see lower portion of FIG. 4). The pulse width of the switching signal SWs is short. The switching signal SWs from the pulse generation circuit 1423 is supplied to the switch circuit 121 via the selector switch circuit 144, not illustrated in FIG. 3. The switch circuit 121 is turned on during the pulse width period of the switching signal SWs. In the sine wave mode, the switching circuit 121 is turned off during periods other than the pulse width period of the switching signal SWs.

When the switch circuit 121 is turned on during the pulse width period of the switching signal SWs, a current flows through the switch circuit 121 to the resonance circuit formed by the primary winding 13a of the transformer 13 and by the resonance capacitor 14. The sine wave voltage VC is thus generated continuously by the oscillation circuit 120R without being attenuated.

It is to be noted here that the delay time DL of the delay circuit 1422 corresponds to ¼ of one cycle T of the sine wave voltage VC past the zero-cross point Zc2. Thus, as seen in the lower portion of FIG. 4, the switch circuit 121 is turned on at the time point at which the sine wave voltage VC reaches zero volts. That means the voltage loss upon switching of the switch circuit 121 is approximately zero.

On the side of the secondary winding 13b of the transformer 13 appears the sine wave signal (sine wave voltage) Ss that is n times the sine wave voltage VC according to the turn ratio of 1:n between the primary winding 13a and the secondary winding 13b is obtained.

The sine wave signal Ss is supplied to the rectifier circuit 17 as well as to the mode switching circuit 150 via the terminal 103 of the IC 100. The rectifier circuit 17 rectifies the sine wave signal Ss to generate the high voltage HV (=HVs). The high voltage (=HVs) generated by the rectifier circuit 17 is supplied as the power supply voltage to the mode switching circuit 150, not depicted in the example of FIG. 3, via the terminal 104 of the IC 100.

The signal from the transmission information generation circuit 110 is supplied as an enable signal to the sine wave control signal generation circuit 142, which puts the sine wave signal generation circuit 120 under enable control. That is, a digital signal of information (see FIG. 5, to be discussed later) sent from the transmission information generation circuit 110 enables the sine wave signal generation circuit 120 while the signal is being "1" and disables the sine wave signal generation circuit 120 while the signal is being "0," for example. As a result, the sine wave signal Ss obtained on the side of the secondary winding 13b of the transformer 13 is modulated by amplitude shift keying (ASK) or by on-off keying (OOK) depending on the transmission signal (digital signal) generated by the transmission information generation circuit 110, as will be discussed later.

Note that, although the transmission signal from the transmission information generation circuit 110 is supplied only to the sine wave control signal generation circuit 142 of the sine wave signal generation circuit 120 in FIGS. 2 and 3, this is not limitative of the present disclosure. Alternatively, a switch circuit may be provided in parallel with the primary winding 13a of the transformer 13 and the capacitor 14 making up the resonance circuit, the switch circuit being controlled to be turned on and off by the signal from the transmission information generation circuit 110 in synchronization with the control of the sine wave control signal generation circuit 142. As another alternative, a switch circuit may be provided to address the sine wave signal Ss input through the terminal 103, the switch circuit being controlled to be turned on and off by the signal from the transmission information generation circuit 110 in synchronization with the control of the sine wave control signal generation circuit 142 for ASK modulation or for OOK modulation.

As a further alternative, the sine wave control signal generation circuit 142 of the sine wave signal generation circuit 120 may be continuously held in an operating state in the sine wave mode. Then, the switch circuit disposed in parallel with the primary winding 13a of the transformer 13 and the capacitor 14 making up the resonance circuit, or the switch circuit provided to address the sine wave signal Ss input through the terminal 103, may be controlled to be turned on and off by the signal from the transmission information generation circuit 110 for ASK modulation or for OOK modulation. Processing operations by the rectangular wave signal generation circuit 130 and by the rectangular wave control signal generation circuit 143

The digital signal of information (see FIG. 5) transmitted from the transmission information generation circuit 110 is supplied as the transmission signal to the level conversion circuit 131 in the rectangular wave signal generation circuit 130. The level conversion signal 131 outputs a zero level (0 volts) while the input binary signal is being "0" and outputs the high voltage HV (HVr) while the binary signal is being "1," thereby generating the rectangular wave signal Sr (see FIG. 5) corresponding to the binary signal. The level conversion circuit 131 then supplies the generated rectangular wave signal Sr to the core 11 of the electronic pen 1 via the mode switching circuit 150 through the terminal 102.

Figure 6:
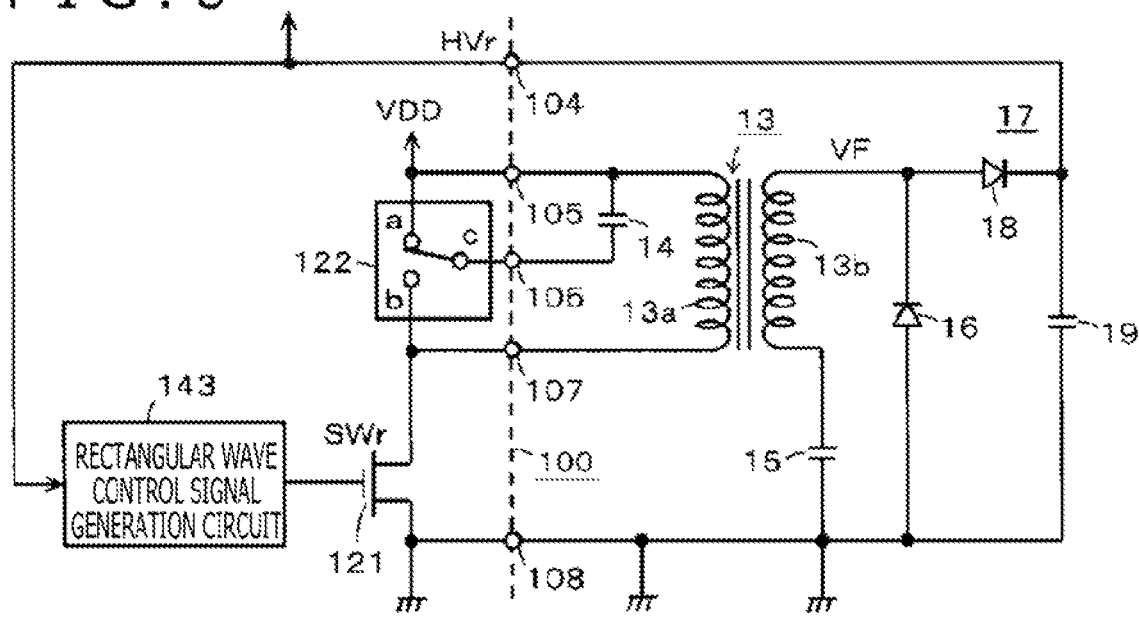
FIG. 6 is another explanatory diagram explaining the rectangular wave mode of the electronic pen in the first embodiment of the present disclosure.
Figure 7:
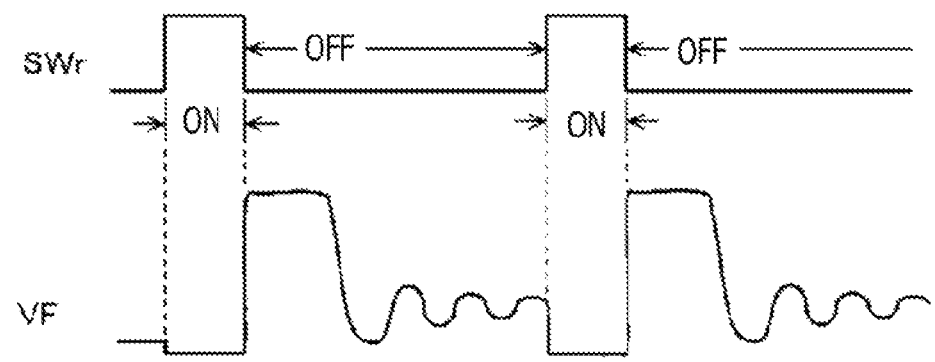
FIG. 7 is an explanatory diagram explaining the rectangular wave mode of the electronic pen in the first embodiment of the present disclosure.

FIG. 6 is an explanatory diagram explaining the processing operation of the rectangular wave control signal generation circuit 143 generating the high voltage HVr in the rectangular wave mode. Also, FIG. 7 is another explanatory diagram further explaining the processing operation. Also in the example of FIG. 6, the switch circuit 121 is configured with an FET, and the selector switch circuit 144 is not illustrated.

In the illustration, the selector switch circuit 122 is in a switching state for the rectangular wave mode, with the common terminal c switched to the switching terminal a to disconnect the parallel connection between the resonance capacitor 14 and the primary winding 13a of the transformer 13. That is, the terminal 105 at which the power supply voltage VDD is obtained is grounded via a series circuit of the primary winding 13a of the transformer 13 and the switch circuit 121 in this circuit configuration.

In the rectangular wave mode, the switch circuit 121 is controlled to be turned on and off by a switching signal SWr (see upper portion of FIG. 7) from the rectangular wave control signal generation circuit 143. On the side of the secondary winding 13b of the transformer 13, a pulsing voltage VF depicted in the lower portion of FIG. 7 is obtained. The rectifier circuit 17 rectifies the pulsing voltage VF to generate the high voltage HV (=HVr).

The rectangular wave control signal generation circuit 143 monitors the high voltage HV (=HVr) received from the rectifier circuit 17 via the terminal 104. In so doing, the rectangular wave control signal generation circuit 143 controls the length of the period in which to turn on the switch circuit 121 using the switching signal SWr such that the high voltage HV (=HVr) becomes, for example, 20 volts in the rectangular wave mode.

Figure 5:
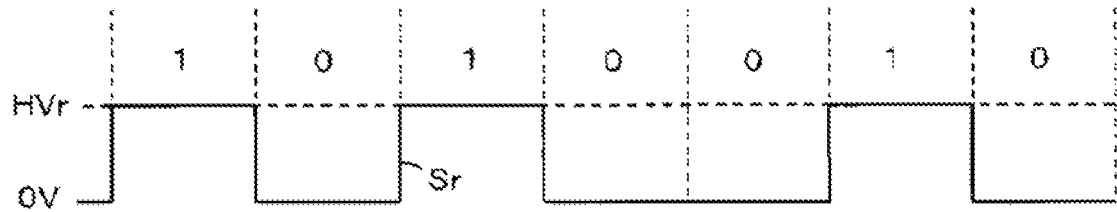
FIG. 5 is an explanatory diagram explaining a rectangular wave mode of the electronic pen in the first embodiment of the present disclosure.

As described above, in the rectangular wave mode, the switch circuit 121 is controlled to be turned on and off by the switching signal SWr from the rectangular wave control signal generation circuit 143 in a manner causing the rectifier circuit 17 to generate the high voltage HV (=HVr). When the high voltage HV (=HVr) is used as the power supply voltage for the level conversion circuit 131 in the rectangular wave signal generation circuit 130, the rectangular wave signal Sr depicted in FIG. 5 is generated. Also, the high voltage HV (=HVr) from the rectifier circuit 17 is used as the power supply voltage for the mode switching circuit 150. This allows the mode switching circuit 150 to output the rectangular wave signal Sr without distortion to the terminal 102.

Mode Switching Control by the Control Circuit 140

A flow of mode switching operations performed by the control circuit 140 is next described below with reference to the flowchart of FIG. 8.

With this embodiment, the user performs a switching operation beforehand on the slide operation button 32 of the slide operation switch 30 along the electronic pen 1 depicted in FIG. 1 in a manner reflecting whether the tablet to be used is the sine wave type or the rectangular wave type.

Figure 8:
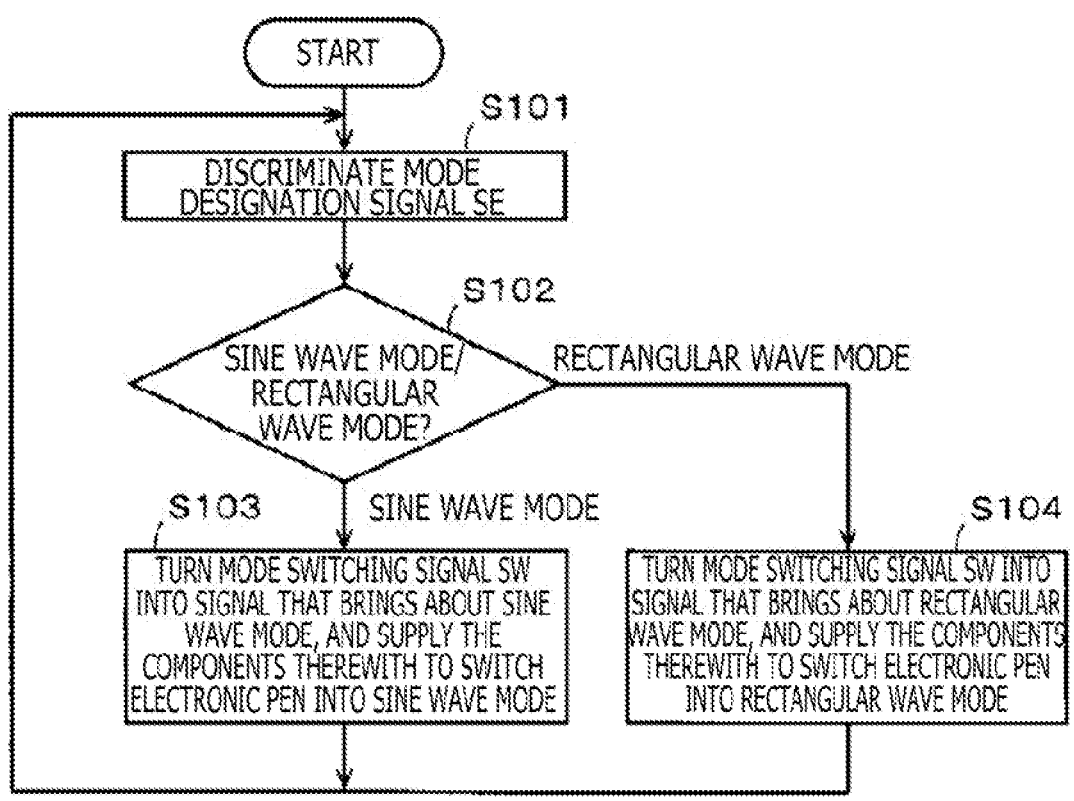
FIG. 8 is a flowchart explaining the flow of a mode switching control process of the electronic pen in the first embodiment of the present disclosure.

As described above, the control circuit 140 of the electronic pen 1 in this embodiment discriminates the mode designation signal SE which is input via the terminal 109 and which represents the switching state of the slide operation switch 30 (S101 in FIG. 8). As a result of the discrimination, the control circuit 140 determines whether the sine wave mode or the rectangular wave mode is designated (S102).

When determining at S102 that the sine wave mode is designated, the control circuit 140 turns the mode switching signal SW from the mode switching signal generation circuit 141 into a signal that switches the electronic pen 1 into the sine wave mode. The mode switching signal SW causes the mode switching circuit 150 to connect the common terminal Cm with the sine wave mode terminal Ts, thereby supplying the sine wave control signal generation circuit 142 with a transmission information signal causing the sine wave signal Ss to be generated, from the transmission information generation circuit 110. Also, the mode switching signal SW causes the selector switch circuit 122 to connect the common terminal c with the terminal b. This connects the capacitor 14 in parallel with the primary winding 13a of the transformer 13 to constitute the resonance circuit, and switches the switch circuit 144 into the state that selects the side of the sine wave control signal generation circuit 142 to activate the oscillation circuit 120R. As a result, the electronic pen 1 is switched into the sine wave mode and made ready to operate in that mode (S103).

When determining at S102 that the rectangular wave mode is designated, the control circuit 140 turns the mode switching signal SW from the mode switching signal generation circuit 141 into a signal that switches the electronic pen 1 into the rectangular wave mode. The mode switching signal SW causes the mode switching circuit 150 to connect the common terminal Cm with the rectangular wave mode terminal Tr, thereby supplying the level conversion circuit 131 of the rectangular wave signal generation circuit 130 with a transmission information signal causing the rectangular wave signal Sr to be generated, from the transmission information generation circuit 110. Also, the mode switching signal SW causes the selector switch circuit 122 to connect the common terminal c with the terminal a. This disconnects the parallel connection between the primary winding 13a of the transformer 13 and the capacitor 14 so as not to constitute the resonance circuit, and switches the switch circuit 144 into the state of selecting the side of the rectangular wave control signal generation circuit 143. As a result, the electronic pen 1 is switched into the rectangular wave mode and made ready to operate in that mode described above (S104).

Following S103 or S104, the control circuit 140 returns control to S101 and repeats the subsequent acts.

Example of a Configuration of the Tablet 2S and the Transmission Signal from the Electronic Pen 1

Described next is an example of a configuration of the tablet for use with the electronic pen 1 of this embodiment. The sine wave type tablet 2S is taken as an example for the explanation.

Figure 9:
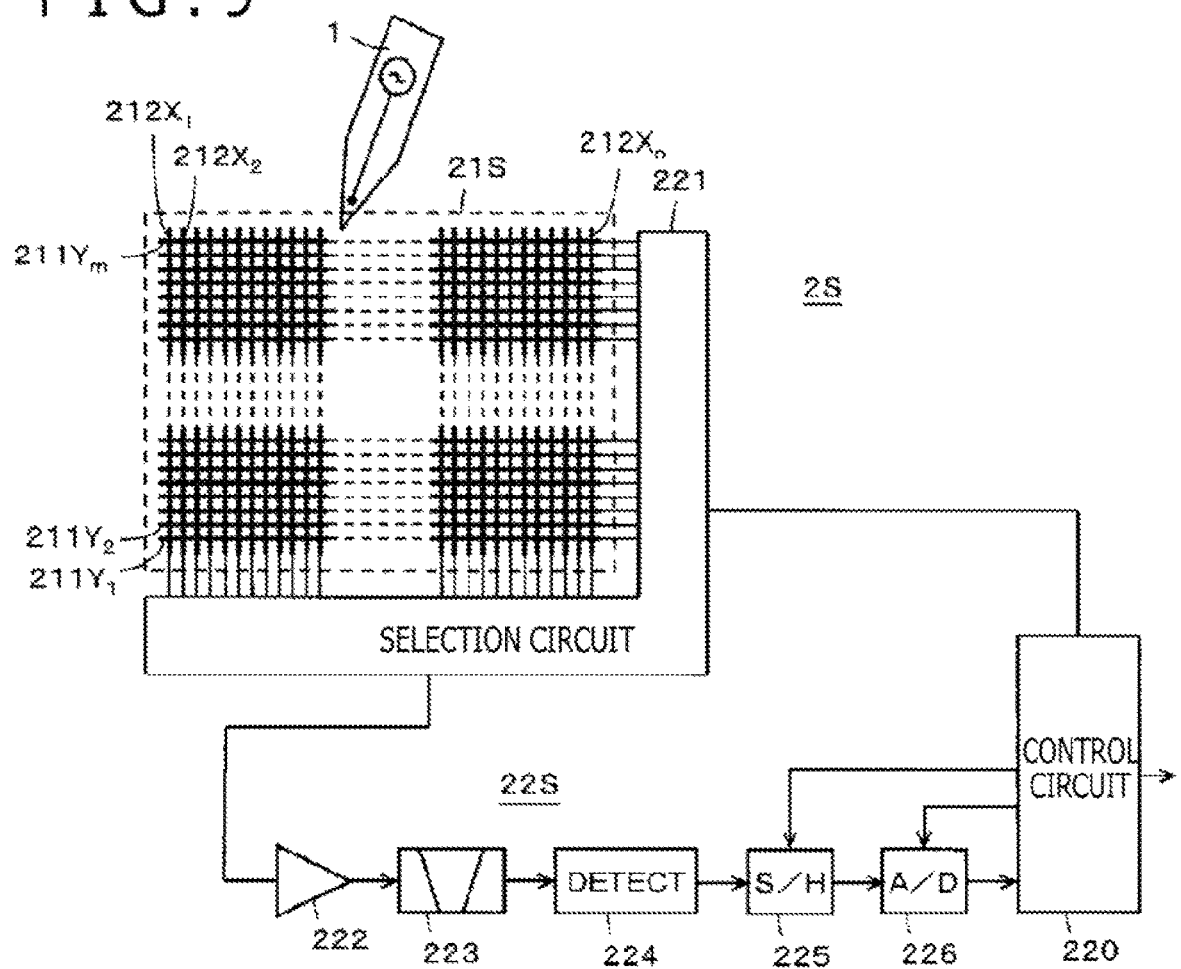
FIG. 9 is a schematic diagram explaining an example of an electrical configuration of a sine wave type tablet of the coordinate input apparatus in the first embodiment of the present disclosure.

FIG. 9 depicts an example of a circuit configuration of key components in the sine wave type tablet 2S for use with the electronic pen 1 in this embodiment. Using the sine wave signal with a frequency of 1.8 MHz, the electronic pen 1 outputs the position detection signal, writing pressure information and side switch information both serving as an example of important additional information regarding the electronic pen 1, and identification information (identifying the electronic pen 1) to the tablet 2S through the core 11. The tablet 2S includes the position detection sensor 21S and the pen indication detection circuit 22S as depicted in FIG. 9.

The position detection sensor 21S is formed by a first conductor group 211, an insulation layer (not illustrated), and a second conductor group 212, which are layered from the bottom up. The first conductor group 211 has multiple first conductors $211Y_1, 211Y_2, \ldots, 211Y_m$ (m is an integer of at least 1) extending crosswise (X axis direction) and arranged a predetermined distance apart in parallel with each other in the Y axis direction.

The second conductor group 212 has multiple second conductors $212X_1, 212X_2, 212X_n$ (n is an integer of at least 1) extending in a direction intersecting with the direction in which the first conductors $211Y_1, 211Y_2, \ldots, 211Y_m$ extend, typically in a lengthwise direction (Y axis direction) perpendicular to the extending direction of the first conductors in this example, and arranged a predetermined distance apart in parallel with each other in the X axis direction.

In the description that follows, the first conductors $211Y_1$, $211Y_2, \ldots, 211Y_m$ will be simply referred to as the first conductors 211Y where there is no need to distinguish the first conductors from one another. Likewise, the second conductors $212X_1, 212X_2, \ldots, 212X_n$ will be simply referred to as the second conductors 212X where there is no need to distinguish the second conductors from one another.

A selection circuit 221 serving as an input/output interface is interposed between a control circuit 220 and the position detection sensor 21S. Based on a control signal from the control circuit 220, the selection circuit 221 is controlled to select one conductor from the first conductor group 211Y and one conductor from the second conductor group 212X. Alternatively, the selection circuit 221 may be controlled simultaneously to select multiple conductors from the first conductor group 211Y and multiple conductors from the second conductor group 212X.

The pen indication detection circuit 22S is configured with an amplification circuit 222 connected with the selection circuit 221, a band-pass filter 223, a detection circuit 224, a sample-hold circuit 225, an analog-to-digital (AD) conversion circuit 226, and the control circuit 220.

A signal from those conductors in the position detection sensor 21S that are selected by the selection circuit 221 using the control signal from the control circuit 220 is input to the pen indication detection circuit 22S. In the pen indication detection circuit 22S, the amplification circuit 222 amplifies the transmission signal formed by a modulated signal of the sine wave signal Ss from the electronic pen 1. The output of the amplification circuit 222 is supplied to the band-pass filter 223 where only the frequency component of the sine wave signal Ss is extracted.

The output signal of the band-pass filter 223 is detected by the detection circuit 224. The output signal of the detection circuit 224 is supplied to the sample-hold circuit 225 where the signal is sampled and held at a predetermined timing using a sampling signal from the control circuit 220, before being converted to a digital value by the AD conversion circuit 226. The digital data from the AD conversion circuit 226 is read and processed by the control circuit 220.

With programs held in an internal ROM, the control circuit 220 operates to output control signals individually to the sample-hold circuit 225, AD conversion circuit 226, and selection circuit 221. Given the digital data from the AD conversion circuit 226, the control circuit 220 calculates the coordinates of the position indicated by the electronic pen 1 on the position detection sensor 21S.

In this example, as described above, the electronic pen 1 is configured to output to the tablet 2S the transmission signal obtained by modulating the sine wave signal Ss by transmission information including the position detection signal from the transmission information generation circuit 110 as well as the writing pressure information and the side switch information.

Figure 10:
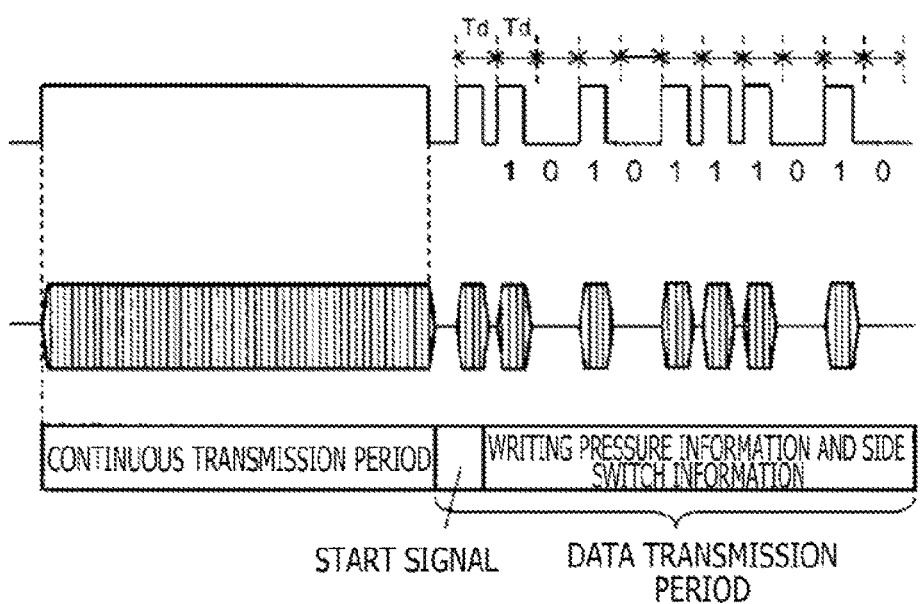
FIG. 10 is a schematic diagram explaining a transmission signal of the electronic pen in the sine wave mode in the first embodiment of the present disclosure.

The upper portion of FIG. 10 illustrates a typical signal supplied from the transmission information generation circuit 110 of the electronic pen 1 to the sine wave control signal generation circuit 142. As depicted in FIG. 10, the signal transmitted from the electronic pen 1 (sine wave signal Ss) in this example presents a repeat pattern of a continuous transmission period and a data transmission period constituting one cycle. That is, the signal Ss output from the electronic pen 1 is the sine wave signal continued as a burst signal as depicted in the middle portion of FIG. 10 during a predetermined continuous transmission period in which the high level of the signal supplied to the sine wave control signal generation circuit 142 is maintained as depicted in the upper portion of FIG. 10 (during the continuous transmission period in the middle portion of FIG. 10).

The continuous transmission period is set to be long enough for the pen indication detection circuit 22S of the tablet 2S to detect the position indicated by the electronic pen 1 on the position detection sensor 21S. For example, the period is to be long enough for the circuit to scan the entire first conductors 211Y and the entire second conductors 212X at least once and preferably multiple times.

At the end of the continuous transmission period, the electronic pen 1 transmits through the core 11 the transmission data that includes the writing pressure information in a multiple-bit value (binary code) representing the writing pressure applied to the electronic pen 1, the side switch on-off information regarding the side switch being turned on or off in one bit or multiple bits, and the identification information.

That is, the transmission information generation circuit 110 of the electronic pen 1 supplies the sine wave control signal generation circuit 142, depicted in FIG. 3, with a transmission data signal that goes High or Low in a predetermined cycle (Td) during the data transmission period at the end of the continuous transmission period, as illustrated in the upper portion of FIG. 10. The signal controls the oscillation circuit 120R to be turned on and off. As a result, the transmission signal from the electronic pen 1 becomes the sine wave signal Ss modulated by amplitude shift keying (ASK) or by on off keying (OOK). That is, as depicted in FIG. 10, ASK modulation or OOK modulation is carried out by performing control such that the sine wave signal is not output when the transmission data (binary code) is "0" and the sine wave signal is output when the transmission data (binary code) is "1."

At this time, a first predetermined cycle (Td) following the continuous transmission period is always High, which is set as a start signal in the lower portion of FIG. 10. The start signal serves as the timing signal that allows the control circuit 220 of the pen indication detection circuit 22S in the tablet 2S to accurately determine the timing for subsequent data output. Alternatively, the start signal as the timing signal may be replaced with a burst sine wave signal during the continuous transmission period.

In the pen indication detection circuit 22S of the tablet 2S in FIG. 9, the control circuit 220 detects the position indicated by the electronic pen 1 on the position detection sensor 21S from the signal received during the continuous transmission period. The control circuit 220 then waits for the continuous transmission period to end. Upon detecting the start signal at the end of the continuous transmission period, the control circuit 220 detects data including the writing pressure information, the side switch information, and the identification information during the data transmission period, and performs operations to restore these pieces of data. The control circuit 220 then outputs information including the information regarding the detected position indicated by the electronic pen 1, the writing pressure information, the side switch information, and the identification information to a host computer, for example.

The configuration and the operations of the sine wave type tablet 2S have been described above in conjunction with the operations of the electronic pen 1 in the sine wave mode. The configuration and the operations of the rectangular wave type tablet 2R in FIG. 6 are substantially the same as those of the sine wave type tablet 2S and thus will not be discussed further in detail. That is, the rectangular wave type tablet 2R has a pen indication detection circuit that detects pen-indicated positions and also detects the writing pressure information, the side switch information, the identification information, and the like information.

It is to be noted, however, that the pen indication detection circuit in the rectangular wave type tablet 2R differs from its counterpart in the sine wave type tablet 2S in that the rectangular wave signal Sr transmitted from the electronic pen 1 is processed. In this case, the rectangular wave signal Sr transmitted from the electronic pen 1 corresponds to the signal depicted in the upper portion of FIG. 10. The pen indication detection circuit in the rectangular wave type tablet 2R is configured to process the rectangular wave signal Sr.

Advantageous Effects of the First Embodiment

The above-described electronic pen 1 is implemented in a manner of being shared with two different tablets, i.e., the sine wave type tablet 2S and the rectangular wave type tablet 2R. Also in the electronic pen 1 of the above-described first embodiment, the circuits including the transformer 13 which generates the high voltage signal are configured to be shared in both the sine wave mode and the rectangular wave mode. This makes it possible to simplify the configuration of the electronic pen 1 and avoid making the electronic pen 1 larger in size.

Second Embodiment

With the first embodiment above, the user operates the slide operation switch 30 to switch the electronic pen into either the sine wave mode or the rectangular wave mode. That means the user needs to know beforehand whether the tablet is the sine wave type or the rectangular wave type. However, the tablet may not be known to the user as the sine wave type or the rectangular wave type. It is thus very convenient if the mode of the electronic pen is switched automatically depending on the tablet type. A second embodiment of the present disclosure is an electronic pen of which the mode is switched automatically depending on the tablet being the sine wave type or the rectangular wave type.

Figure 11:
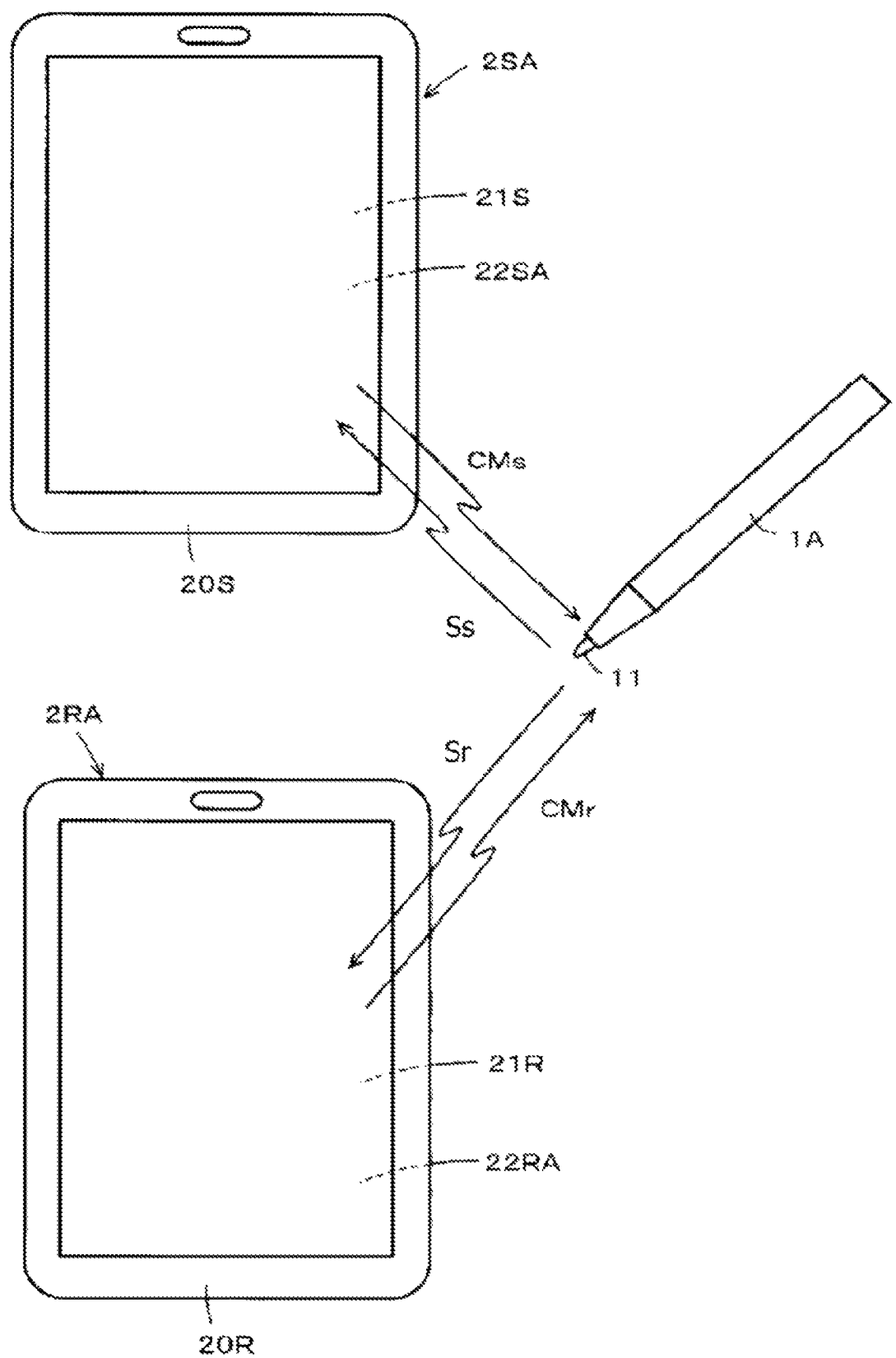
FIG. 11 is a schematic diagram explaining an outline of a coordinate input apparatus in a second embodiment of the present disclosure.

FIG. 11 is a schematic diagram explaining an outline of a coordinate input apparatus formed by an electronic pen 1A and by a sine wave type tablet 2SA and a rectangular wave type tablet 2RA in the second embodiment of the present disclosure. Those components in FIG. 11 that are the same as in FIG. 1 are designated by the same reference characters.

The electronic pen 1A of the second embodiment is not equipped with the slide operation switch 30 attached to the electronic pen 1 of the first embodiment, as illustrated in FIG. 11. On the other hand, the sine wave type tablet 2SA of the second embodiment has a function that outputs type designation information CMs indicating that the tablet is the sine wave type. The rectangular wave type tablet 2RA of the second embodiment has a function that outputs type designation information CMr indicating that the tablet is the rectangular wave type.

The electronic pen 1A of the second embodiment is configured, like the electronic pen 1 of the first embodiment, to have the sine wave mode in which to generate the sine wave signal Ss as the transmission signal and the rectangular wave mode in which to generate the rectangular wave signal Sr as the transmission signal, and to switch automatically between the two modes upon receipt of the type designation information CMs or CMr from the tablet 2SA or 2RA.

In the second embodiment, the tablets 2SA and 2RA, as with the tablets 2S and 2R in the first embodiment, have the position detection sensors 21S and 21R inside the housings 20S and 20R, respectively. Furthermore, the tablets 2SA and 2RA output the type designation information CMs and CMr via the position detection sensors 21S and 21R, respectively. Thus, in the tablets 2SA and 2RA of the second embodiment, pen indication detection circuits 22SA and 22RA are configured to connect with the position detection sensors 21S and 21R for signal processing, respectively and to provide functions of performing the process of detecting positions and the other processes by receiving the sine wave signal Ss or Sr from the electronic pen 1A and of outputting the type designation information CMs and CMr via the position detection sensors 21S and 21R, respectively.

In this embodiment, the electronic pen 1A is configured to output the sine wave signal Ss or the rectangular wave signal Sr via the core 11 and to receive the type designation information CMs from the tablet 2SA or the type designation information CMr from the tablet 2RA through the core 11. The electronic pen 1A in the second embodiment is configured to execute two modes on a time-sharing basis, i.e., a transmission mode in which to transmit the sine wave signal Ss or the rectangular wave signal Sr, and a reception mode in which to receive the type designation information CMs or the type designation information CMr, as will be discussed later.

Likewise, the tablet 2SA or 2RA is configured to execute two modes by time sharing, i.e., a transmission mode in which to transmit the type designation information CMs or the type designation information CMr, and a reception mode in which to receive the sine wave signal Ss or the rectangular wave signal Sr. Under timing control based on the received signal from the tablet 2SA or from the tablet 2RA, the time-sharing processing of the electronic pen 1A is synchronized with the time-sharing processing of the tablet 2SA or 2RA. That is, when the electronic pen 1A is in the transmission mode, the tablet 2SA or 2RA is in the reception mode; when the electronic pen 1A is in the reception mode, the tablet 2SA or 2RA is in the transmission mode. When the electronic pen 1A of the second embodiment is in the transmission mode, either the sine wave mode or the rectangular wave mode is selected.

In the second embodiment, the electronic pen 1A is always in the reception mode when not made ready to receive the signal from the position detection sensor 21S or 21R of the tablet 2SA or 2RA. When the electronic pen 1A is brought closer to the tablet 2SA or 2RA and made ready to receive the type designation information CMs or CMr, the electronic pen 1A discriminates whether the capacitively coupled tablet is the tablet 2SA or the tablet 2RA on the basis of the received type designation information CMs or CMr.

The electronic pen 1A then starts time-sharing control of the transmission period and reception period according to the timing at which the type designation information CMs or CMr is received from the tablet 2SA or from the tablet 2RA. When the discriminated type is the sine wave type, the electronic pen 1A enters the sine wave mode to generate the sine wave signal Ss during the transmission period, and outputs the generated sine wave signal Ss to the tablet 2SA via the core 11. When the discriminated type is the rectangular wave type, the electronic pen 1A enters the rectangular wave mode to generate the rectangular wave signal Sr during the transmission period, and outputs the generated rectangular wave signal Sr to the tablet 2RA via the core 11.

At this time, as discussed above, the tablet 2SA or 2RA is synchronized with the time-sharing timing of the electronic pen 1A in the transmission and reception periods. The tablet 2SA or 2RA during the reception period receives the sine wave signal Ss or the rectangular wave signal Sr reflecting the tablet type, and performs the processes of detecting the position indicated by the electronic pen 1A, detecting the writing pressure information and the identification information regarding the electronic pen 1A, and handling other additional information.

The electronic pen 1A of the second embodiment is automatically switched into the sine wave mode or the rectangular wave mode according to the type of the tablet 2SA or 2RA. This allows the user of the electronic pen 1A to indicate the position on the tablet 2SA or 2RA without being aware of whether the tablet is the tablet 2SA or the tablet 2RA, which is very convenient.

Figure 12:
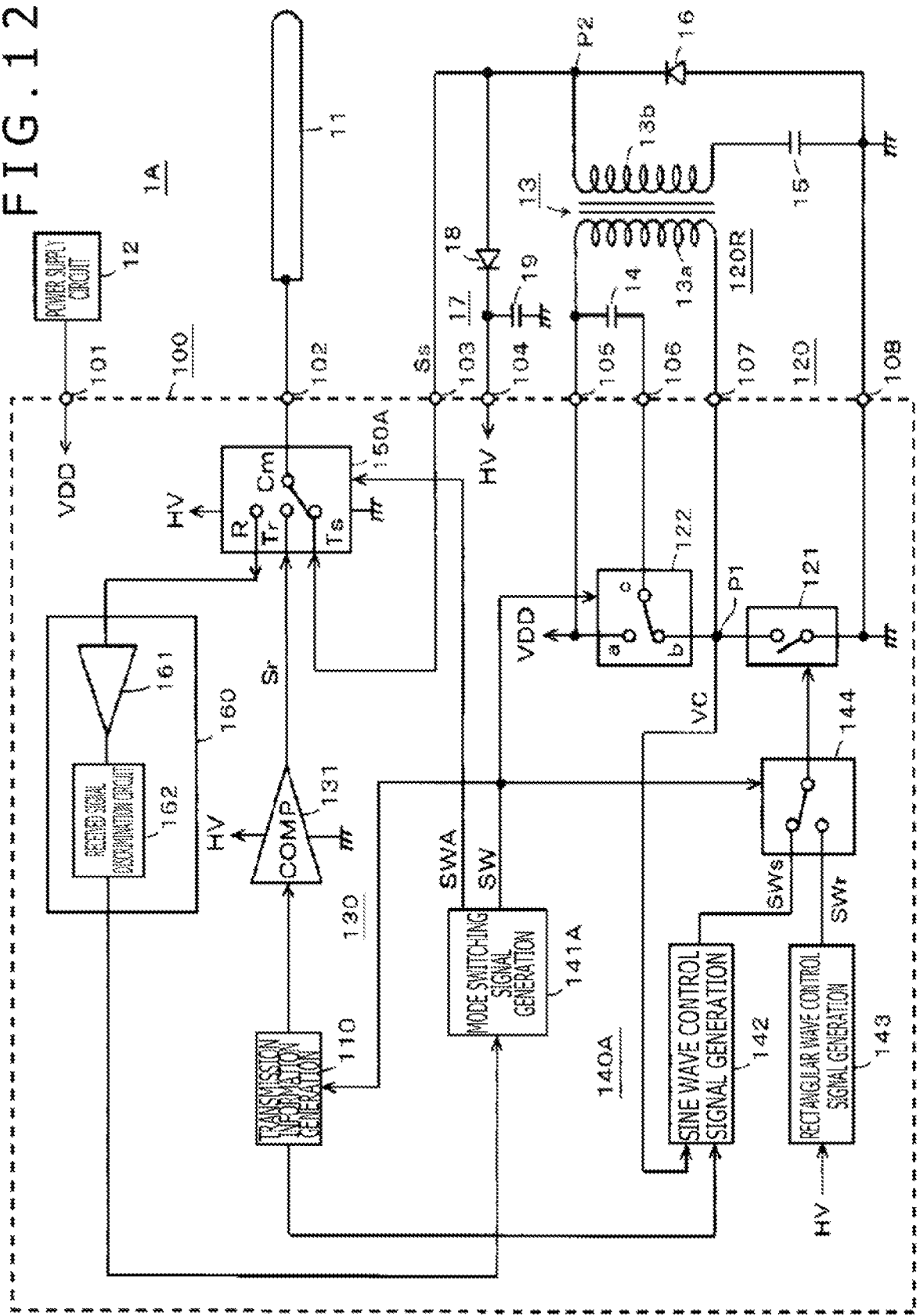
FIG. 12 is a block diagram depicting an example of an electrical configuration of an electronic pen in the second embodiment of the present disclosure.

Example of an Electrical Configuration of the Electronic Pen 1A in the Second Embodiment FIG. 12 is a block diagram depicting an example of an electrical configuration of the electronic pen 1A in the second embodiment. The electrical configuration of the electronic pen 1A of the second embodiment differs from that of the electronic pen 1 of the first embodiment solely in that the electronic pen 1A automatically enters the sine wave mode or the rectangular wave mode upon receipt of the type designation information CMs from the tablet 2SA or the type designation information CMr from the tablet 2RA. The remaining features of the electronic pen 1A are the same as those of the electronic pen 1. Those electrically configured components in FIG. 12 that are the same as those of the electronic pen 1 of the first embodiment depicted in FIG. 2 are designated by the same reference characters and will not be discussed further.

That is, the IC 100 of the second embodiment is not provided with the terminal 109, as depicted in FIG. 12. The second embodiment further differs from the first embodiment in that the mode switching circuit 150 and the mode switching signal generation circuit 141 are replaced with a mode switching circuit 150A and a mode switching signal generation circuit 141A, respectively, and that a received signal processing circuit 160 is provided.

In the electronic pen 1A of the second embodiment, the core 11 is used not only to transmit the position detection signal from the electronic pen 1A but also to receive the type designation information CMs or CMr from the position detection sensor 21S or 21R of the tablet 2SA or 2RA.

The mode switching circuit 150A is provided with a reception terminal R in addition to the sine wave mode terminal Ts, the rectangular wave mode terminal Tr, and the common terminal Cm. Given the mode switching signal from the mode switching signal generation circuit 141A of a control circuit 140A, the mode switching circuit 150A is switched so as to connect the common terminal Cm with one of the reception terminal R, the sine wave mode terminal Ts, and the rectangular wave mode terminal Tr. That is, when the electronic pen 1A is in the reception mode period, the mode switching circuit 150A is switched so as to connect the common terminal Cm with the reception terminal R. When the electronic pen 1A is in the transmission mode period, the mode switching circuit 150A is switched so as to connect the common terminal Cm with either the sine wave mode terminal Ts or the rectangular wave mode terminal Tr.

The reception terminal R of the mode switching circuit 150A is connected with the input terminal of the received signal processing circuit 160. The received signal processing circuit 160 is made up of an amplifier 161 and a received signal discrimination circuit 162. Upon receipt of a signal from the amplifier 161, the received signal discrimination circuit 162 discriminates whether the received signal is the type designation information CMs or the type designation information CMr. The received signal discrimination circuit 162 then supplies the result of the discrimination, i.e., whether the received signal is the type designation information CMs or the type designation information CMr, to the mode switching signal generation circuit 141A of the control circuit 140A. Also, the received signal discrimination circuit 162 generates from the received signal a timing signal for synchronizing with the transmission mode period and the reception mode period of the tablet 2SA or 2RA, and supplies the generated timing signal to the mode switching signal generation circuit 141A.

Based on the result of the discrimination by the received signal discrimination circuit 162, i.e., about whether the received signal is the type designation information CMs or the type designation information CMr, the mode switching signal generation circuit 141A determines whether the transmission mode of the electronic pen 1A is the sine wave mode or the rectangular wave mode. Also, given the timing signal from the received signal discrimination circuit 162, the mode switching signal generation circuit 141A determines the timing at which to switch between the transmission mode period and the reception mode period by time sharing.

As with the first embodiment, the mode switching signal generation circuit 141A generates the mode switching signal SW for switching between the sine wave mode and the rectangular wave mode as well as a mode switching signal SWA for switching control of the mode switching circuit 150A. That is, in the second embodiment, the mode switching circuit 150A is switched not by the mode switching signal SW but by the mode switching signal SWA.

The mode switching signal SWA causes the mode switching circuit 150A to connect the common terminal Cm with the reception terminal R during the reception mode period and with either the sine wave mode terminal Ts or the rectangular wave mode terminal Tr for the determined mode during the transmission mode period.

The remaining components of the configuration, i.e., the transmission information generation circuit 110, the sine wave signal generation circuit 120, the rectangular wave signal generation circuit 130, and the circuits 142, 143 and 144 in the control circuit 140A except for the mode switching signal generation circuit 141A, are the same as those of the electronic pen 1 in the first embodiment and thus will not be discussed further.

Mode Switching Control by the Control Circuit 140A

As described above, on the basis of the type designation information CMs received from the tablet 2SA or the type designation information CMr from the tablet 2RA, the control circuit 140A of the electronic pen 1A in the second embodiment determines the mode for the electronic pen 1A and performs transmission/reception mode switching management including time-sharing management of the transmission mode and the reception mode.

An example of a flow of the processing operations performed by the control circuit 140A is described with reference to the flowcharts of FIGS. 13 and 14.

Figure 13:
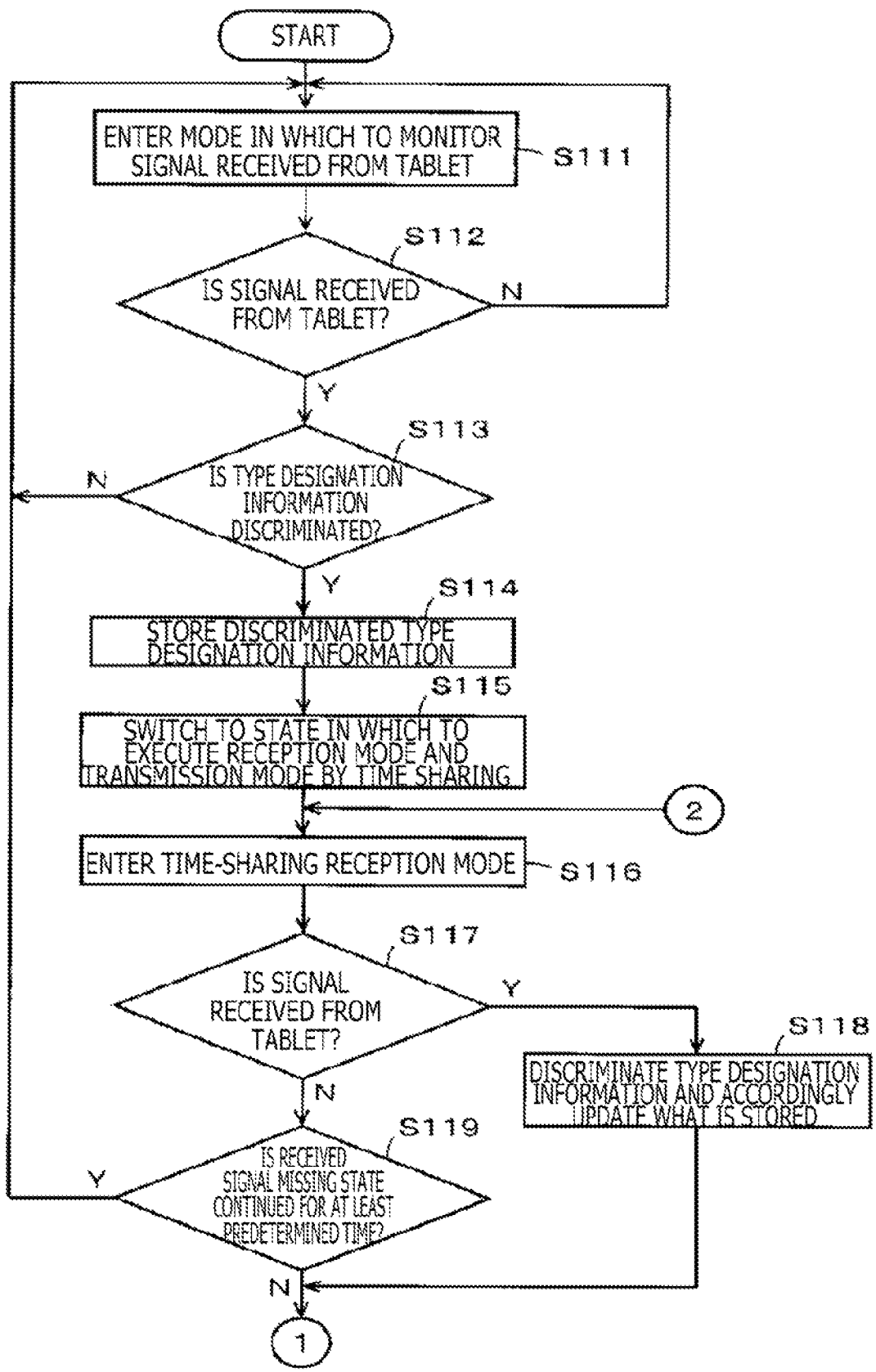
FIG. 13 is a flowchart explaining a flow of a mode switching control process of the electronic pen in the second embodiment of the present disclosure.
Figure 14:
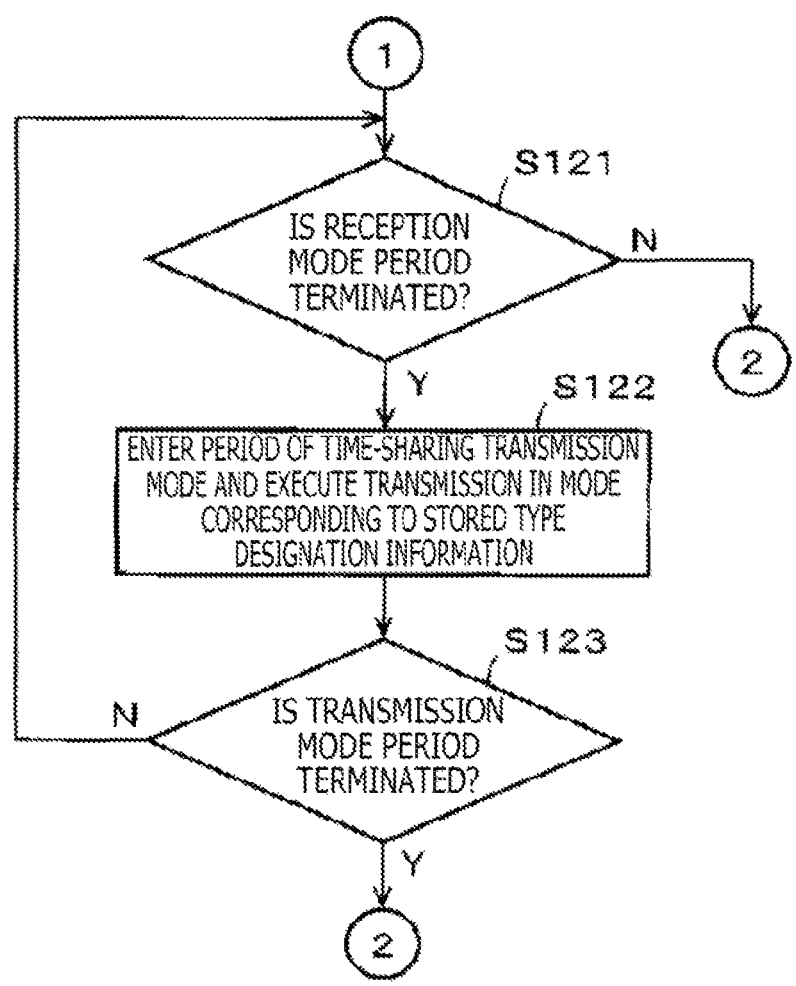
FIG. 14 is another flowchart explaining the flow of the mode switching control process of the electronic pen in the second embodiment of the present disclosure.

Using the mode switching signal SWA from the mode switching signal generation circuit 141A, the control circuit 140A causes the mode switching circuit 150A to connect the common terminal Cm with the reception terminal R to switch the electronic pen 1A into a mode of monitoring the signal received from the tablet 2SA or from the tablet 2RA (S111 in FIG. 13). The control circuit 140A then discriminates whether the signal from the tablet 2SA or from the tablet 2RA is received (S112).

When the electronic pen 1A is away from the tablet 2SA or from the tablet 2RA, the electronic pen 1A does not receive the signal from the tablet 2SA or 2RA. Thus, the control circuit 140A in S112 determines that no signal is received, returns control to S111, and continues the mode of monitoring the signal received from the tablet 2SA or from the tablet 2RA.

The electronic pen 1A, when brought closer to the tablet 2SA or 2RA, may determine at S112 that the signal from the tablet 2SA or from the tablet 2RA is received. At this point, the control circuit 140A determines whether either the sine wave type designation information CMs or the rectangular wave type designation information CMr is discriminated (S113). When determining at S113 that neither the sine wave type designation information CMs nor the rectangular wave type designation information CMr is discriminated, the control circuit 140A returns control to S111 and carries out the subsequent acts.

When determining at S113 that either the sine wave type designation information CMs or the rectangular wave type designation information CMr is discriminated, the control circuit 140A stores (S114) the type designation information CMs or CMr as the result of the discrimination into an internal buffer memory (not illustrated) in the mode switching signal generation circuit 141A.

The control circuit 140A then determines to switch to a state where the reception mode and the transmission mode are executed on a time-sharing basis (S115). Using the mode switching signal SWA from the mode switching signal generation circuit 141A, the control circuit 140A causes the mode switching circuit 150A to connect the common terminal Cm with the reception terminal R to switch the electronic pen 1A into the reception mode (S116).

The control circuit 140A then discriminates whether the signal from the tablet 2SA or from the tablet 2RA is received (S117). When determining at S117 that the signal from the tablet 2SA or from the tablet 2RA is received, the control circuit 140A updates the type designation information in the buffer memory with the type designation information CMs or CMr received and discriminated by the received signal discrimination circuit 162 (S118).

When determining at S117 that the signal from the tablet 2SA or from the tablet 2RA is no longer received, the control circuit 140A discriminates whether a received signal missing state following the disappearance of the received signal is continued for at least a predetermined time Ta (S119). Here, the predetermined time Ta is set to be longer than a short time period in which the electronic pen 1A, temporarily separated from the tablet 2SA or from the tablet 2RA, is expected to be again brought closer thereto for continuous indication input. Note that the predetermined time Ta may span one or multiple reception mode periods.

When determining at S119 that the received signal missing state is continued longer than the predetermined time Ta, the control circuit 140A returns control to S111, switches to the mode of monitoring the signal received from the tablet 2SA or from the tablet 2RA, and repeats the acts subsequent to S111.

When determining at S119 that the received signal missing state is not continued longer than the predetermined time Ta, the control circuit 140A returns control to S116 and continues the reception mode. Also, following S118, the control circuit 140A discriminates whether the period of the time-sharing reception mode is terminated (S121 in FIG. 14). When determining that the time-sharing reception mode period is not yet terminated, the control circuit 140A returns control to S116 and continues the reception mode.

When determining at S121 that the time-sharing reception mode is terminated, the control circuit 140A determines to switch the electronic pen 1A into the transmission mode. In accordance with the type designation information stored in the buffer memory, the control circuit 140A switches the mode switching circuit 150A using the mode switching signal SWA from the mode switching signal generation circuit 141A, switches the selector switch circuit 122 using the switching control signal SW, and switches the selector switch circuit 144 using the mode switching signal SW so as to execute the transmission mode (S122).

That is, when the type designation information CMs is stored in the buffer memory, the electronic pen 1A is in the sine wave mode during the transmission mode period. The mode switching signal SWA causes the mode switching circuit 150A to connect the common terminal Cm with the sine wave mode terminal Ts. At the same time, the mode switching signal SW causes the selector switch circuit 122 to connect the common terminal c with the switching terminal b. This connects the resonance capacitor 14 in parallel with the primary winding 13a of the transformer 13 to constitute the resonance circuit. Furthermore, the mode switching signal SW causes the selector switch circuit 144 to be switched into a state where the switching signal SWs from the sine wave control signal generation circuit 142 is supplied to the switch circuit 121 for execution of on-off control. This makes the oscillation circuit 120R ready for the oscillation operation.

Thus, in the sine wave mode, the electronic pen 1A is in the state where the sine wave signal Ss is obtained on the side of the secondary winding 13b of the transformer 13, as discussed above with reference to FIGS. 3 and 4. This is a state in which the sine wave mode signal Ss is supplied to the core 11 via the terminal 103 of the IC 100 through the mode switching circuit 150A and the terminal 102. The mode switching circuit 150A is supplied with the high voltage HV (=HVs) provided as the power supply voltage by the rectifier circuit 17 rectifying the sine wave signal Ss. This allows the sine wave signal Ss to be supplied without distortion to the core 11 through the mode switching circuit 150A.

Also, when the type designation information CMr is stored in the buffer memory, the electronic pen 1A is in the rectangular wave mode during the timing-sharing transmission mode period. The mode switching signal SWA causes the mode switching circuit 150A to connect the common terminal Cm with the rectangular wave mode terminal Tr. At the same time, the mode switching signal SW causes the selector switch circuit 122 to connect the common terminal c with the switching terminal a, thereby disconnecting the parallel connection between the resonance capacitor 14 and the primary winding 13a of the transformer 13. Furthermore, the mode switching signal SW causes the selector switch circuit 144 to be switched into a state where the switching signal SWr from the rectangular wave control signal generation circuit 143 is supplied to the switch circuit 121 for execution of on-off control.

Thus, as discussed above with reference to FIGS. 5 to 7, the electronic pen 1A in the rectangular wave mode is in the state where the rectangular wave signal Sr from the rectangular wave signal generation circuit 130 is supplied to the core 11 via the mode switching circuit 150A and the terminal 102. The mode switching circuit 150A is supplied with the high voltage HV (=HVr) rectified and generated as the power supply voltage by the rectifier circuit 17 for the secondary winding 13b of the transformer 13. This allows the rectangular wave signal Sr to be supplied without distortion to the core 11 through the mode switching circuit 150A.

Following S122, the control circuit 140A discriminates whether the transmission mode period is terminated (S123). When determining that the transmission mode period is not yet terminated, the control circuit 140A returns control to S122 and continues the transmission mode. When determining at S123 that the transmission mode period is terminated, the control circuit 140 returns control to S116 in FIG. 13, switches the electronic pen 1A into the reception mode, and repeats the acts subsequent to S116.

Example of a Configuration of the Tablet 2S in the Second Embodiment

Described next is an example of a configuration of the tablet for use with the electronic pen 1A of the second embodiment. The sine wave type tablet 2SA is taken as an example for the explanation.

Figure 15:
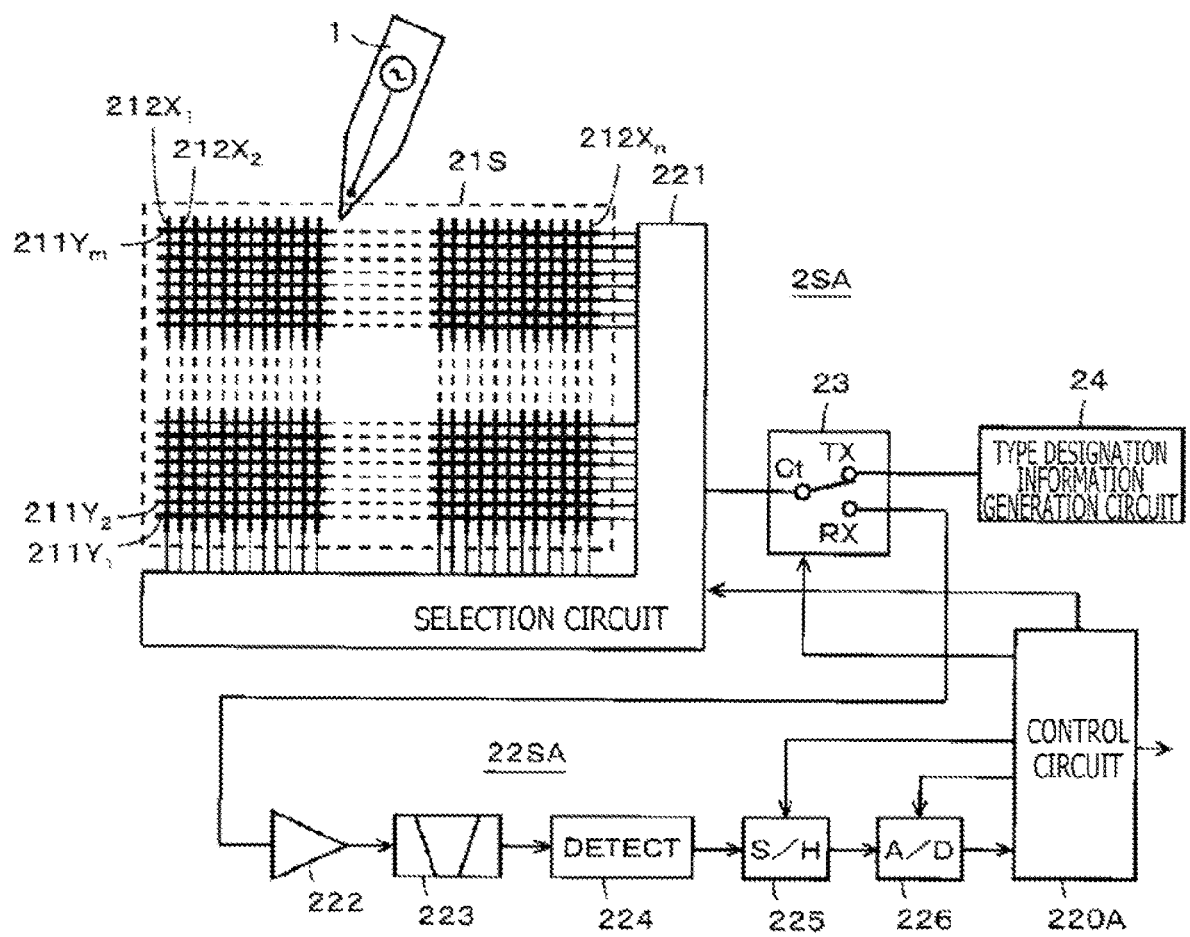
FIG. 15 is a schematic diagram explaining an example of an electrical configuration of a sine wave type tablet of the coordinate input apparatus in the second embodiment of the present disclosure.

FIG. 15 depicts a circuit example of key components in the sine wave type tablet 2SA used in conjunction with the electronic pen 1A of the second embodiment. Of the components in the circuit example in FIG. 15, those that are the same as in the sine wave type tablet 2S of the first embodiment in FIG. 9 are designated by the same reference characters, and their explanations are omitted hereunder.

As illustrated in FIG. 15, the tablet 2SA includes a selector switch circuit 23 and a type designation information generation circuit 24 in addition to the position detection sensor 21S and the pen indication detection circuit 22S. The type designation information generation circuit 24 outputs type designation information CMs indicating that the tablet 2S is of the sine wave type.

The selector switch circuit 23 is switched by a control circuit 220A, to be discussed later, between the time when the type designation information CMs is transmitted and the time when the sine wave signal Ss is received from the electronic pen 1A. A transmission side terminal TX of the selector switch circuit 23 is connected with the output terminal of the type designation information generation circuit 24, and a reception side terminal RX of the selector switch circuit 23 is connected with the amplification circuit 222 in the pen indication detection circuit 22S. A common terminal Ct of the selector switch circuit 23 is connected with the selection circuit 221 serving as an input/output interface with the position detection sensor 21S.

On the basis of the control signal from the control circuit 220A, the selection circuit 221 is controlled to select one or multiple conductors from the first conductor group 211Y and/or from the second conductor group 212X at the time of transmitting the type designation information CMs. At the time of receiving the sine wave signal Ss from the electronic pen 1A, the selection circuit 221 is controlled so as to select one conductor from the first conductor group 211Y and one conductor from the second conductor group 212X. Alternatively, the selection circuit 221 may be controlled to simultaneously select multiple conductors from the first conductor group 211Y and multiple conductors from the second conductor group 212X.

The control circuit 220A, as described above, causes the selector switch circuit 23 to switch the tablet 2SA between the transmission mode and the reception mode on a time-sharing basis. In the transmission mode, the control signal from the control circuit 220A causes the selector switch circuit 23 to connect the common terminal Ct with the transmission side terminal TX. This causes the type designation information CMs from the type designation information generation circuit 24 to be supplied either to one conductor or to multiple conductors via the selector switch circuit 23 and the selection circuit 221. From the conductors, the type designation information CMs is transmitted to the electronic pen 1A.

Upon receipt of the type designation information CMs, the electronic pen 1A discriminates that the tablet 2SA is of the sine wave type, as discussed above. Then, in synchronization with the tablet 2SA switching between the transmission mode and the reception mode, the electronic pen 1A switches between the reception mode and the transmission mode as described above. In the transmission mode, the electronic pen 1A transmits the sine wave signal Ss to the tablet 2SA.

When the electronic pen 1A is in the transmission mode, the control circuit 220A of the tablet 2SA is in the reception mode. With the tablet 2SA in the reception mode, the control signal from the control circuit 220A causes the selector switch circuit 23 to connect the common terminal Ct with the reception side terminal RX. This allows the sine wave signal Ss sent from the electronic pen 1A to be input to the pen indication detection circuit 22S via the switch circuit 23 through those conductors in the position detection sensor 21S that are selected by the selection circuit 221. In turn, the pen indication detection circuit 22S detects the signal from the electronic pen 1A to determine the position indicated thereby, as discussed above in connection with the first embodiment.

In accordance with programs stored in an internal ROM, the control circuit 220A outputs control signals individually to the sample-hold circuit 225, the AD conversion circuit 226, and the selection circuit 221, and supplies the switching control signal to the selector switch circuit 23 causing it to switch between the transmission mode and the reception mode. Also, given digital data from the AD conversion circuit 226, the control circuit 220A calculates the coordinates of the position indicated by the electronic pen 1 on the position detection sensor 21S.

The configuration and the operations of the sine wave type tablet 2SA have been described above in connection with the operations of the electronic pen 1A in the sine wave mode. Also, the configuration and the operations of the pen indication detection circuit 22R in the rectangular wave type tablet 2RA are substantially the same as discussed above. That is, the rectangular wave type tablet 2RA includes the position detection sensor 21R identical to the position detection sensor 21S and a type designation information generation circuit that generates the rectangular wave type designation information CMr. Also provided is the pen indication detection circuit 22R that processes the signal received from the electronic pen 1A in the rectangular wave mode to perform position detection and detects the writing pressure information, the side switch information, and the identification information, among others.

It has been described above that there are two kinds of tablet type designation information, i.e., the type designation information CMs designating the sine wave type and the type designation information CMr designating the rectangular wave type. Alternatively, either one of these two kinds of tablet type designation information alone may be provided. For example, in the case where the sine wave type tablet outputs the type designation information CMs but the rectangular wave type tablet does not output the type designation information, the electronic pen, when not receiving the type designation information CMs, determines that the tablet is the rectangular wave type. Conversely, the rectangular wave type tablet alone may output the type designation information CMr.

Advantageous Effects of the Second Embodiment

The electronic pen 1 of the second embodiment discussed above detects the type designation information CMs from the tablet 2S or the type designation information CMr from the tablet 2R to determine which type of tablet is now capacitively coupled and ready for position indication, and switches automatically to the mode corresponding to the type of the tablet 2S or 2R. This is very convenient for the user in that there is no need for the user to know the tablet type beforehand.

Third Embodiment

Figure 16:
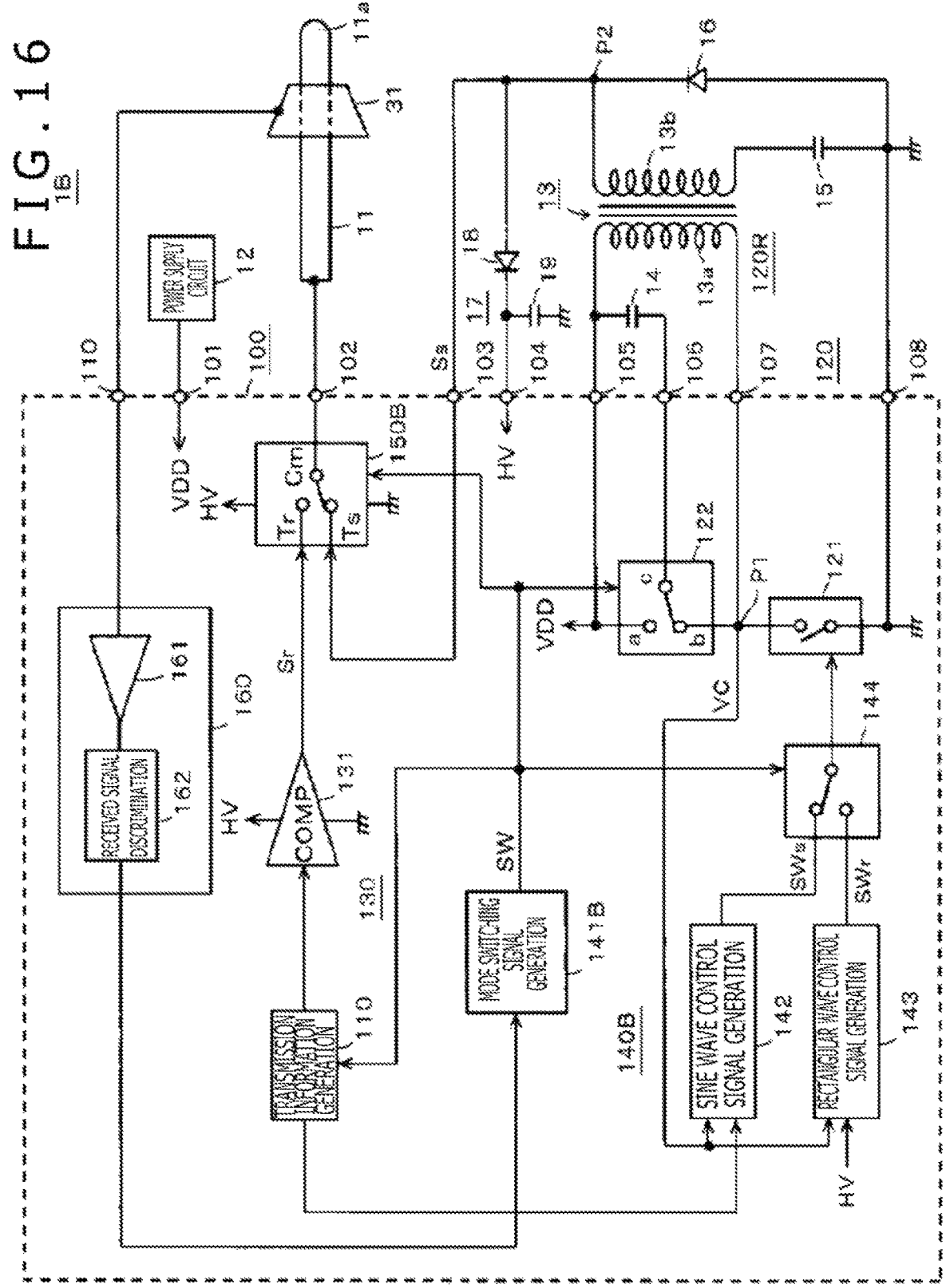
FIG. 16 is a block diagram depicting an example of an electrical configuration of an electronic pen in a third embodiment of the present disclosure.

A third embodiment of the present disclosure is a variation of the second embodiment. That is, the electronic pen of the third embodiment, to be described below, differs structurally from the above-described electronic pen 1A of the second embodiment in terms of the core-side member and the related components. The rest of the configuration of the electronic pen in the third embodiment is the same as that of the electronic pen 1A in the second embodiment. FIG. 16 depicts an example of an electrical configuration of the electronic pen 1B in the third embodiment. Of the components in the example of FIG. 16, those that are the same as in the electronic pen 1A of the second embodiment in FIG. 12 are designated by the same reference characters.

In the electronic pen 1A of the above-described second embodiment, the conductive core 11 constitutes the core-side member for exchanging signals with the tablet 2SA or 2RA. Thus, the electronic pen 1A of the second embodiment is switched between the transmission mode and the reception mode on a time-sharing basis, using the core 11 for both transmission and reception.

By contrast, the electronic pen 1B of the third embodiment is configured to have the core-side member formed by a conductive core 11 and a conductive sleeve member 31, as depicted in FIG. 16, so that either the conductive core 11 or the conductive sleeve member 31 is used for transmission and the other for reception.

Although not illustrated in detail, the sleeve member 31 is attached to the pen tip of the cylindrical housing of the electronic pen 1B in a manner electrically insulated from the core 11. That is, the sleeve member 31 is a hollow member externally shaped as a truncated cone and has a ring-like cross-section in a direction perpendicular to the center line direction (axial direction) of the truncated cone shape. As depicted in FIG. 16, the core 11 penetrates through the hollow interior of the sleeve member 31. A tip 11a of the core 11 protrudes on the pen tip side of the housing of the electronic pen 1B.

In the example of FIG. 16, the core 11 is used solely for transmission purposes as with the electronic pen 1 of the first embodiment. The sleeve member 31 is used to receive the type designation information CMs from the tablet 2SA or the type designation information CMr from the tablet 2RA. The type designation information CMs or CMr received by the sleeve member 31 from the tablet 2SA or 2RA is supplied to the received signal processing circuit 160 via a terminal 110 of the IC 100.

Alternatively, the sleeve member 31 may be configured for transmission and the core 11 for receiving the type designation information CMs or CMr from the tablet 2RA or 2SA.

With the electronic pen 1B of the third embodiment, there is no need to switch between the transmission mode and the reception mode by time sharing. Thus, a mode switching circuit 150B of the third embodiment is configured the same as the mode switching circuit 150 of the electronic pen 1 in the first embodiment. The mode switching circuit 150B is configured to omit the reception terminal R and have the common terminal Cm connected with either the sine wave mode terminal Ts or the rectangular wave mode terminal Tr. Also, in the electronic pen 1B of the third embodiment, a mode switching signal generation circuit 141B of a control circuit 140B generates only the mode switching signal SW as in the case of the electronic pen 1 of the first embodiment. The mode switching circuit 150B is switched by the mode switching signal SW.

That is, upon receipt of the signal from the sleeve member 31 via the amplifier 161, the received signal discrimination circuit 162 of the received signal processing circuit 160 discriminates whether the type designation information CMs from the tablet 2SA or the type designation information CMr from the tablet 2RA is received. According to the result of the discrimination by the received signal discrimination circuit 162, the mode switching signal generation circuit 141B generates the mode switching signal SW. When the mode switching signal SW causes the electronic pen 1B to discriminate that the type designation information CMs is received, the mode switching circuit 150B has the common terminal Cm connected with the sine wave mode terminal Ts. When the mode switching signal SW causes the electronic pen 1B to discriminate that the type designation information CMr is received, the mode switching circuit 150B has the common terminal Cm connected with the rectangular wave mode terminal Tr. The rest of the configuration is the same as in the electronic pen 1A of the second embodiment.

With the electronic pen 1B of the third embodiment, there is no need to switch between the transmission mode and the reception mode on a time-sharing basis. The electronic pen 1B need only perform timing control to output the transmission signal generated by the transmission information generation circuit 110 during the reception mode period of the tablet 2S or 2R. This provides an advantage of making mode management processing simpler than with the electronic pen 1A of the second embodiment.

Fourth Embodiment

In the second and the third embodiments described above, the core-side member for receiving the type designation information CMs or CMr from the tablet 2SA or 2RA constitutes the input reception circuit that receives designation input specifying whether the electronic pen is to output the sine wave signal or the rectangular wave signal from the signal transmission circuit. However, the configuration of the input reception circuit is not limited to what has been discussed above.

Figure 17:
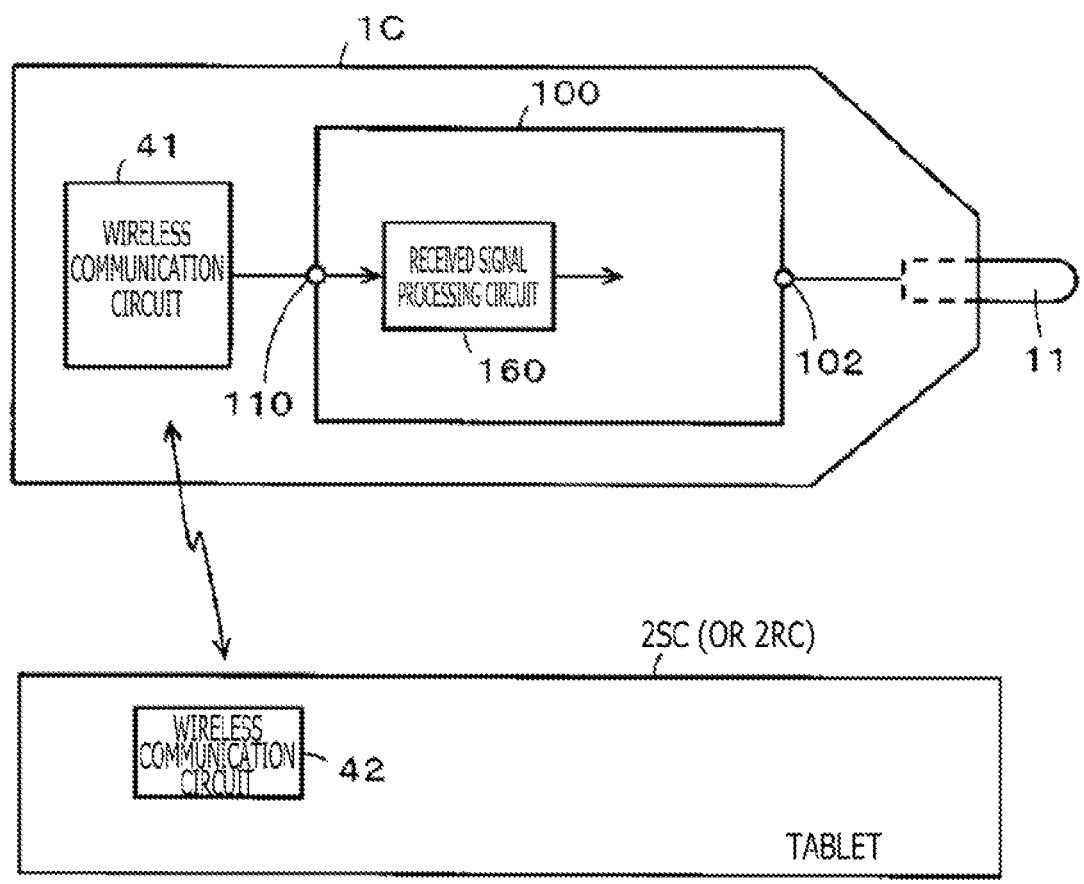
FIG. 17 is a schematic diagram explaining outlines of an electronic pen and a tablet constituting a coordinate input apparatus in a fourth embodiment of the present disclosure.

A fourth embodiment of the present disclosure is an example in which components other than the core-side member make up the input reception circuit receiving the type designation information CMs or CMr from the tablet 2SA or 2RA. FIG. 17 depicts a configuration example of key components of an electronic pen 1C, a sine wave type tablet 2SC, and a rectangular wave type tablet 2RC in the fourth embodiment.

In the fourth embodiment, the electronic pen 1C exchanges the type designation information CMs or CMr with the tablet 2SC or 2RC by wireless communication. The electronic pen 1C is thus provided with a wireless communication circuit 41. The tablet 2SC or 2RC is furnished with a wireless communication circuit 42 wirelessly communicating with the wireless communication circuit 41 of the electronic pen 1C.

That is, the electronic pen 1C of the fourth embodiment has the input reception circuit made up of the wireless communication circuit 41. The wireless communication circuits 41 and 42 in this embodiment may be configured with circuits that perform wireless communication in accordance with the Bluetooth (registered trademark) standard, for example. The wireless communication circuits 41 and 42 are not limited to the above configuration. Also, a wireless communication section is not limited to radio waves. Alternatively, other wireless communication sections may be implemented using infrared rays or other kinds of light.

In the fourth embodiment, the wireless communication circuit 42 of the tablet 2SC or 2RC modulates the type designation information CMs or CMr for conversion into a signal for wireless transmission to the wireless communication circuit 41 of the electronic pen 1C. The wireless communication circuit 41 of the electronic pen 1C demodulates the received signal to restore the type designation information CMs or CMr, and supplies the restored information to the received signal processing circuit 160 via the terminal 110 of the IC 100.

In the electronic pen 1C, as in the above-described electronic pen 1A or 1B of the second or the third embodiment, the received signal discrimination circuit 162 of the received signal processing circuit 160 discriminates whether the received signal is the type designation information CMs or the type designation information CMr. Based on the result of the discrimination, the electronic pen 1C is switched into the sine wave mode or into the rectangular wave mode.

With the fourth embodiment, as described above, when the wireless communication circuits 41 and 42 enter a state where wireless communication therebetween is made available, the electronic pen 1C is automatically switched into the sine wave mode or into the rectangular wave mode depending on whether the partner of wireless communication is the tablet 2SC or the tablet 2RC.

Variations of the Second Through the Fourth Embodiments

It has been described above in connection with the second through the fourth embodiments that only the type designation information CMs or CMr is transmitted as the transmission signal from the tablet 2SA, 2SB or 2SC or from the tablet 2RA, 2RB or 2RC. Alternatively, other signals in addition to the type designation information CMs or CMr may be transmitted to the electronic pen 1A, 1B or 1C. Such additional signals may include information indicative of the start timing of the reception mode period for the tablet 2SA, 2SB or 2SC or for the tablet 2RA, 2RB or 2RC.

Fifth Embodiment

The electronic pen of a fifth embodiment is configured to further reduce power consumption of the primary or the secondary battery constituting the power supply circuit 12, compared with the electronic pen 1, 1A, 1B or 1C of the first, the second, the third, or the fourth embodiment.

The sine wave signal Ss generated by the electronic pen 1, 1A, 1B or 1C in the sine wave mode of the above-described embodiments has the frequency defined by the resonance circuit formed by the primary winding 13a of the transformer 13 and by the resonance capacitor 14. The resonance circuit in this case includes stray capacitance as well. As described above, the time point at which the switch circuit 121 is switched to let the oscillation circuit 120R including the resonance circuit keep generating the sine wave signal Ss is the time point at which the voltage of the sine wave signal Ss becomes zero, which translates into very little power loss.

However, the electronic pen 1, 1A, 1B or 1C of the first, the second, the third or the fourth embodiment includes the switch circuit 122 switching between two states, i.e., the state where the resonance capacitor 14 is connected in parallel with the primary winding 13a of the transformer 13, and the state where the parallel connection between the resonance capacitor 14 and the primary winding 13a of the transformer 13 is disconnected. The selector switch circuit 122 is typically configured with two transistors. In the sine wave mode, there occurs a state where the transistor interposed between the common terminal c and the switching terminal b of the selector switch circuit 122 has on-resistance present. Thus, in the sine wave mode, there occurs power loss due to the on-resistance of the switch circuit 122.

Furthermore, with the electronic pen 1, 1A, 1B or 1C in the rectangular wave mode of the first, the second, the third or the fourth embodiment, the switch circuit 121 is not switched at the time point where the voltage generated by the transformer 13 reaches zero volts. That means there can be significant power loss if there is stray capacitance.

Figure 18:
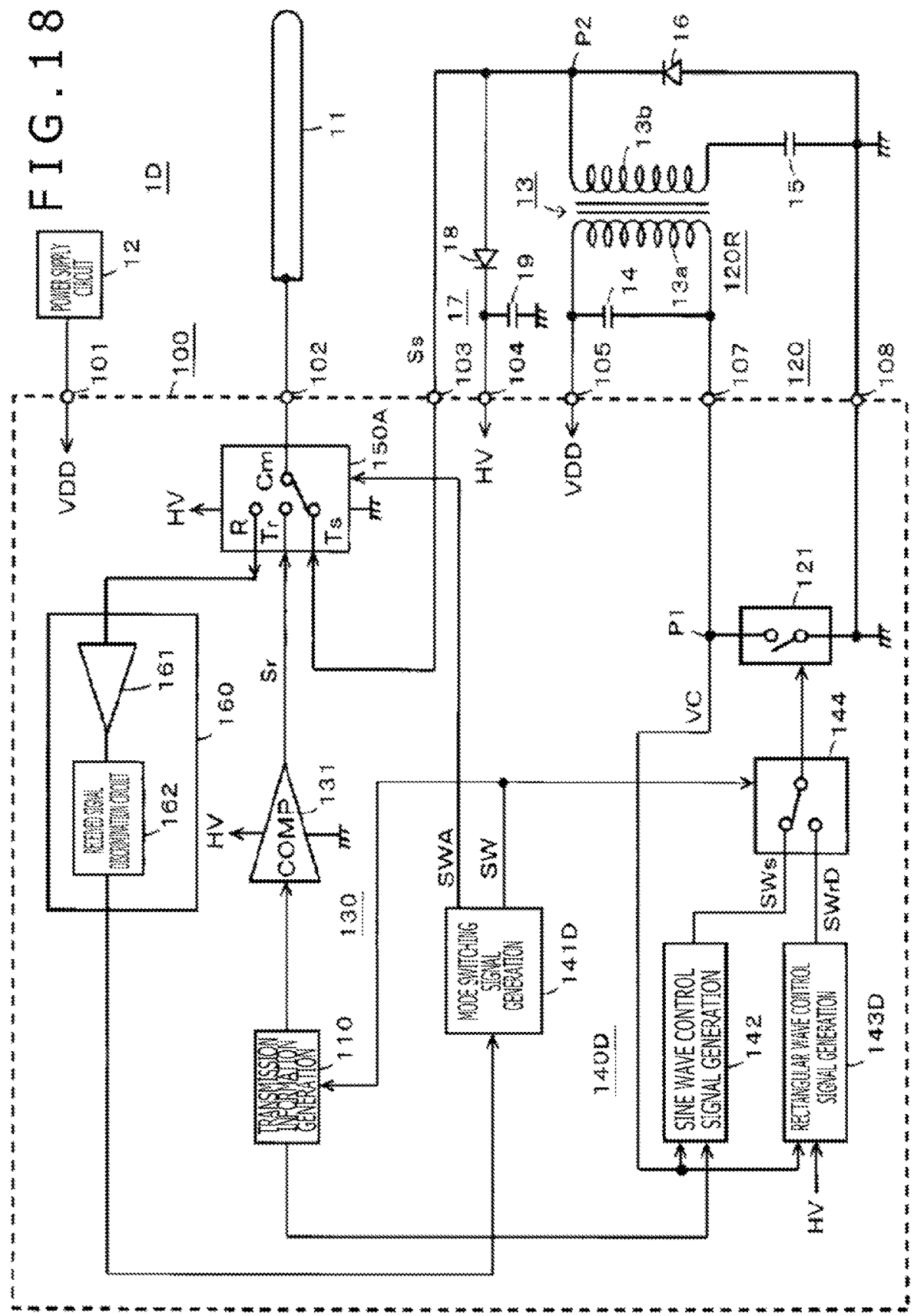
FIG. 18 is a block diagram depicting an example of an electrical configuration of an electronic pen in a fifth embodiment of the present disclosure.

The fifth embodiment is designed to configure an electronic pen that solves the above problems and minimizes power loss. FIG. 18 depicts an example of an electrical configuration of an electronic pen 1D of the fifth embodiment. The example in FIG. 18, as with the example of the electrical configuration of the electronic pen 1A in the second embodiment in FIG. 12, is the case where the type designation information CMs or CMr from the position detection sensor 21S or 21R of the tablet 2SA or 2RA is received via the core 11. Of the components in FIG. 18, those that are the same as in the electronic pen 1A of the second embodiment in FIG. 12 are designated by the same reference characters, and their detailed explanations are omitted hereunder.

As illustrated in FIG. 18, the electronic pen 1D of the fifth embodiment does not include the selector switching circuit 122. The resonance capacitor 14 is fixedly connected in parallel with the primary winding 13a of the transformer 13. As a result, the terminal 106 of the IC 100 is eliminated.

Also, a control circuit 140D of the electronic pen 1D in the fifth embodiment includes a rectangular wave control signal generation circuit 143D that differs from the rectangular wave control signal generation circuit 143 of the above-described second embodiment. The rectangular wave control signal generation circuit 143D is supplied with both the high voltage HV (=HVr) output from the rectifier circuit 17 and a voltage VC (=VCr) obtained at the connection point P1 for the primary winding 13a of the transformer 13 in the rectangular wave mode. The rest of the configuration is the same as in the electronic pen 1A of the second embodiment.

The control operations performed by the mode switching circuit 150A of the electronic pen 1D in the fifth embodiment, as well as the processing operations executed thereby in the reception mode, are identical to those carried out by the electronic pen 1A of the second embodiment.

When the transmission mode is the sine wave mode, what takes place is the same as in the electronic pen 1A of the second embodiment. In this case, there is no selector switch circuit 122 in the electronic pen 1D, so that the on-resistance stemming from the selector switch circuit 122 in the electronic pen 1 of the second embodiment does not exist. This makes it possible for the electronic pen 1D of the fifth embodiment in the sine wave mode to let the oscillation circuit 120R keep oscillating as a result of the switching executed by the switch circuit 121 at the time points at which the sine wave voltage VC reaches zero volts. The sine wave signal Ss is thus generated without power loss, and the rectifier circuit 17 provides the high voltage HV (=HVs).

Figure 19:
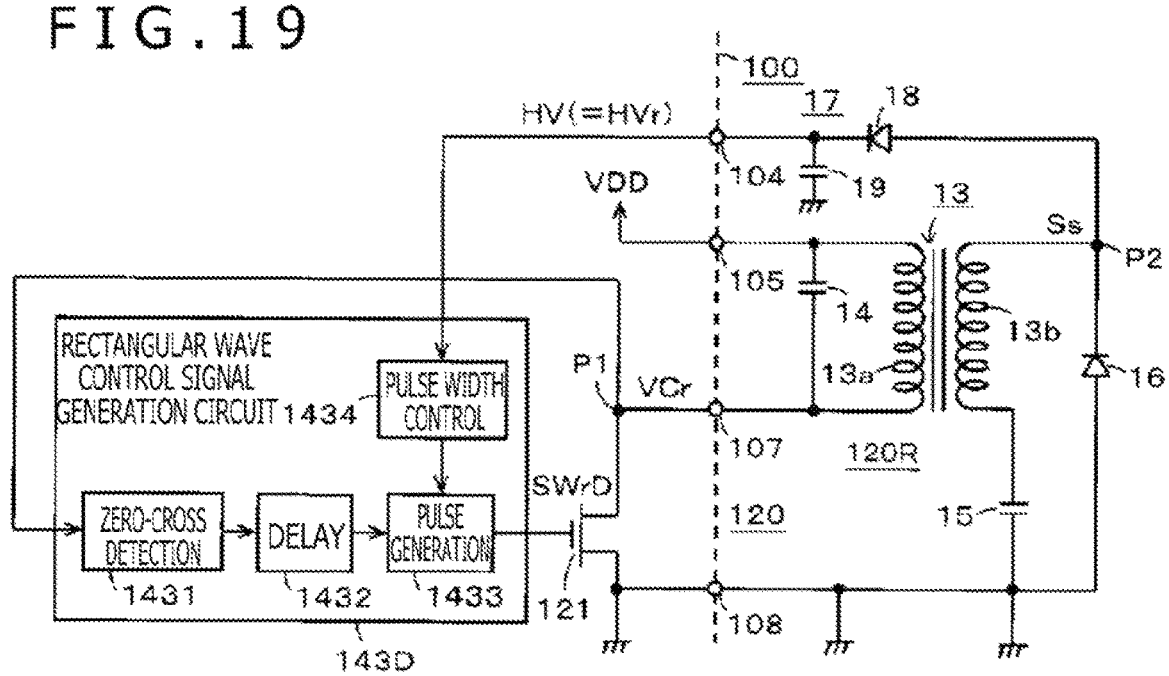
FIG. 19 is an explanatory diagram explaining the rectangular wave mode of the electronic pen in the fifth embodiment of the present disclosure.
Figure 20:
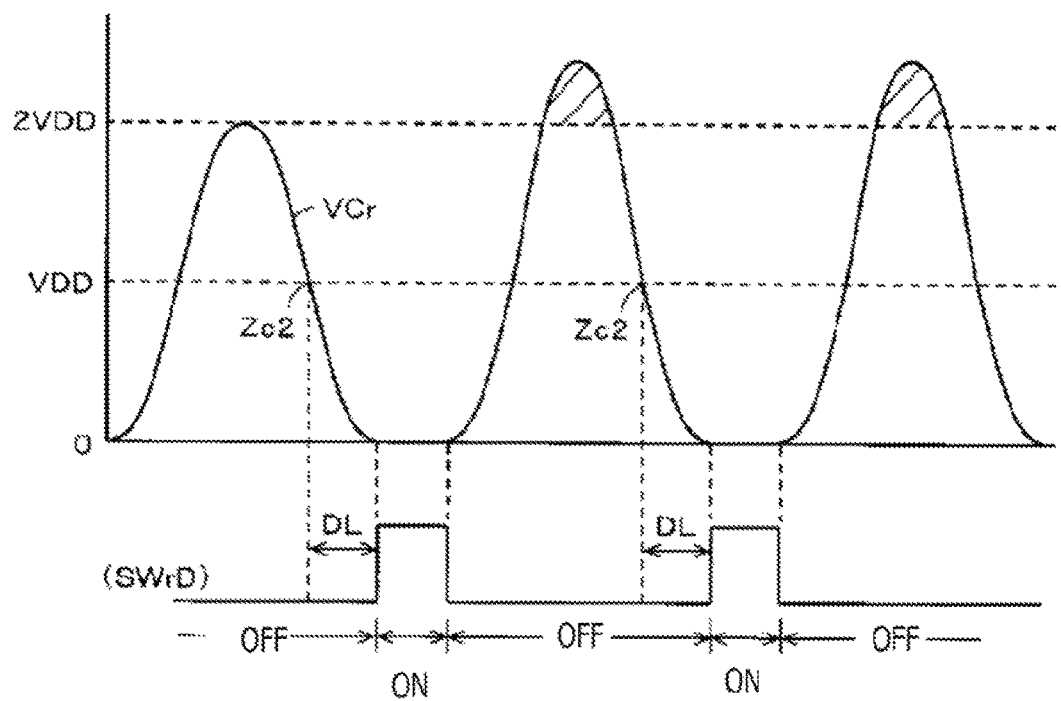
FIG. 20 is an explanatory diagram explaining the rectangular wave mode of the electronic pen in the fifth embodiment of the present disclosure.

Described below with reference to FIGS. 19 and 20 is an example of a configuration of the rectangular wave control signal generation circuit 143D in the electronic pen 1D of the fifth embodiment, as well as the operations performed by the rectangular wave control signal generation circuit 143D when the transmission mode is the rectangular wave mode.

In the electronic pen 1D of the fifth embodiment, the resonance capacitor 14 is connected in parallel with the primary winding 13a of the transformer 13 in the rectangular wave mode as well. As a result, a sine wave-like voltage VCr depicted in the upper portion of FIG. 20 is obtained at the connection point P1 between the primary winding 13a of the transformer 13 and the switch circuit 121.

The rectangular wave control signal generation circuit 143D of the electronic pen 1D in the fifth embodiment includes a pulse width control circuit 1434 in addition to the circuit configuration similar to that of the sine wave control signal generation circuit 142 in FIG. 3, the configuration being made up of a zero-cross detection circuit 1431, a delay circuit 1432, and a pulse generation circuit 1433. The zero-cross detection circuit 1431 receives input of the voltage VCr obtained at the connection point P1. The pulse width control circuit 1434 receives input of the high voltage HV (=HVr) from the rectifier circuit 17.

The zero-cross detection circuit 1431 and the delay circuit 1432 are configured the same as the zero-cross detection circuit 1421 and the delay circuit 1422 in the sine wave control signal generation circuit 142. The pulse generation circuit 1433 generates a switching signal SWrD (see lower portion of FIG. 20) and is configured to produce pulses not with a fixed pulse width but with a pulse width varied upon receipt of a control signal from the pulse width control circuit 1434. In this case, the pulse width of the switching signal SWrD output from the pulse generation circuit 1433 is larger than the pulse width of the switching signal SWs output from the sine wave control signal generation circuit 142.

The switch circuit 121 is turned on during the pulse width period of the switching signal SWrD from the rectangular wave control signal generation circuit 143D and is turned off during the other periods. The pulse width control circuit 1434 performs on-time control of the switch circuit 121 in a manner adjusting the pulse width of the switching signal SWrD from the pulse generation circuit 1433 such that the high voltage HV will become the high voltage HVr in the rectangular wave mode.

That is, as illustrated in FIG. 20, in the electronic pen 1D in the rectangular wave mode of the fifth embodiment, the switching signal SWrD from the rectangular wave control signal generation circuit 143D presents a pulse width period delayed by the delay time DL of ¼ of one cycle T of the sine wave signal Ss in the sine wave mode from the zero-cross point Zc2 of the sine wave voltage VCr obtained at the connection point P1, as illustrated in FIG. 20. Thus, the switch circuit 121 is turned on at time points where the sine wave voltage VCr becomes zero volts.

However, in the rectangular wave mode, the pulse width period of the switching signal SWrD is longer than that of the switching signal SWs in the sine wave mode. That means zero volts continue over the pulse width period of the switching signal SWrD. As a result, the sine wave-like voltage VCr presents a deformed sine waveform as depicted in the upper portion of FIG. 20.

When the switch circuit 121 is turned off at the end of the pule width period of the switching signal SWrD, the sine wave-like voltage VCr becomes larger in amplitude than the sine wave voltage VC in the sine wave mode by as much as a portion corresponding to the pulse width period of the switching signal SWrD. That is, the sine wave-like voltage VCr becomes higher than the voltage 2 VDD by the shaded portion in the upper portion of FIG. 20. Thus, the sine wave-like voltage VCr of the large amplitude waveform is boosted in keeping with the turn ratio of the primary winding 13a to the secondary winding 13b in the transformer 13, the sine wave-like voltage VCr being further rectified by the rectifier circuit 17. This generates in the rectangular wave mode the high voltage HV (=HVr) that is higher than the high voltage HV (=HVs) in the sine wave mode.

The high voltage HV thus generated is supplied to the pulse width control circuit 1434 in the rectangular wave control signal generation circuit 143D as described above. The pulse width control circuit 1434 in the rectangular wave control signal generation circuit 143D controls the pulse width period of the switching signal SWrD in such a manner that the input high voltage HV becomes the high voltage HVr in the rectangular wave mode. This controls the on-period length of the switch circuit 121 illustrated in the lower portion of FIG. 20. Accordingly, a size (area) of the shaded portion of the sine wave-like voltage VCr in the upper portion of FIG. 20 is controlled. As a result, the high voltage HV output from the rectifier circuit 17 is controlled to become the high voltage HVr in the rectangular wave mode.

Because the selector switch circuit 122 does not exist in the electronic pen 1D of the fifth embodiment, there is no power loss stemming from the on-resistance of the selector switch circuit 122, which further contributes to reducing power consumption.

Also in the rectangular wave mode, the electronic pen 1D of the fifth embodiment has the switch circuit 121 switched at the timing at which the sine wave-like voltage VCr becomes zero volts. This substantially eliminates power loss. As a result, the electronic pen 1D of the fifth embodiment minimizes power consumption of the primary battery or the secondary battery of the power supply circuit 12, thereby prolonging battery life.

In the electronic pen 1D of the fifth embodiment depicted in FIG. 18, the sine wave control signal generation circuit 142 and the rectangular wave control signal generation circuit 143D are separately provided. However, as is evident from the foregoing description, the zero-cross detection circuit 1421 may double as the zero-cross detection circuit 1431 or vice versa and the delay circuit 1422 may double as the delay circuit 1432 or vice versa in the sine wave control signal generation circuit 142 and in the rectangular wave control signal generation circuit 143D. Thus, in the fifth embodiment, the sine wave control signal generation circuit 142 and the rectangular wave control signal generation circuit 143D may be configured to share the zero-cross detection circuit and the delay circuit. This arrangement further simplifies the circuit configuration.

OTHER EMBODIMENTS OR VARIATIONS

In the above embodiments, it has been described that the IC-based signal processing circuit of the electronic pen has the mode switching circuits 150, 150A, 150B, 150C, and 150D included in the IC 100. Alternatively, the mode switching circuits 150, 150A, 150B, 150C, and 150D may be provided as external components of the IC 100. Also, in the above embodiments, it has been also described that most of the components of the signal processing circuit in the electronic pen are provided in IC form. Obviously, however, these components may alternatively be provided as discrete components making up electronic circuits.

Also, in the above embodiments, it has been also described that the sine wave signal generation circuit 120 is configured as an externally excited oscillation circuit. However, the present disclosure is not limited to this configuration. Also, the configuration of the rectifier circuit 17 is obviously not limited to what has been described in the configurations of the above embodiments.

Also, in the above embodiments, it has been described that the waveform of the first signal is the sine waveform and the waveform of the second signal is the rectangular waveform. However, the waveform of the second signal is not limited to the rectangular waveform and may be some other waveform such as a triangular waveform. The waveform of the first signal is also not limited to the sine waveform and may be some other waveform.

In the above embodiments, it has been also described that the signal from the transmission information generation circuit 110 controls the sine wave control signal generation circuit 142 in a manner converting the sine wave signal into an ASK-modulated signal or an OOK-modulated signal using the transmission information. However, the present disclosure is not limited to this configuration. Alternatively, the transmission information generation circuit 110 may not control the sine wave control signal generation circuit 142. Instead, a modulation circuit (for ASK or OOK modulation) may be provided to address the sine wave signal obtained as a continuous wave signal on the side of the secondary winding 13b of the transformer 13. The transmission information may then be supplied to this modulation circuit to obtain the ASK-modulated or OOK-modulated signal thereby.

It is to be noted that the embodiment of the present disclosure is not limited to the foregoing embodiment, and that various changes can be made without departing from the spirit of the present disclosure.

What is claimed is:
1. An electronic pen comprising:
a conductive core-side member;
a power supply circuit;
a signal transmission circuit which, in operation, receives a power supply voltage from the power supply circuit, generates a first signal and a second signal each having a different waveform, and selectively supplies either the first signal or the second signal to the core-side member, wherein the first signal is configured to be used by a first type of tablet, and the second signal is configured to be used by a second type of tablet that is different from the first type of tablet, wherein a wave type of the first signal is different from a wave type of the second signal, and wherein the first signal is a sine wave and the second signal is a rectangular wave;
an input reception circuit which, in operation, receives a designation input designating that the electronic pen is to be used with either the first type of type of tablet or the second type of tablet; and a control circuit which, in operation, controls the signal transmission circuit to supply the first signal to the core-side member if the designation input designates that the electronic pen is to be used with the first type of tablet, and controls the signal transmission circuit to supply the second signal to the core-side member if the designation input designates that the electronic pen is to be used with the second type of tablet.

2. The electronic pen according to claim 1,
wherein the signal transmission circuit includes a signal switching circuit which, in operation, selects either the first signal or the second signal and supplies the selected signal to the core-side member, and a sine wave signal generation circuit which, in operation, generates a sine wave signal as the first signal,
wherein the sine wave signal generation circuit includes a transformer of which a primary winding side is connected with a capacitor to constitute a resonance circuit, a secondary winding side of the transformer outputting the sine wave signal, and
wherein the secondary winding side of the transformer is coupled to a rectifier circuit of which an output voltage is used as the power supply voltage for the signal switching circuit.

3. The electronic pen according to claim 2,
wherein a turn ratio of the primary winding to the secondary winding in the transformer is 1:n, where n>0.

4. The electronic pen according to claim 1,
wherein the signal transmission circuit includes a sine wave signal generation circuit which, in operation, generates a sine wave signal as the first signal,
wherein the sine wave signal generation circuit includes a transformer of which a primary winding side is connected with a capacitor to constitute a resonance circuit, a secondary winding side of the transformer outputting the sine wave signal, and
wherein the secondary winding side of the transformer is coupled to a rectifier circuit of which an output voltage is used as the power supply voltage for generating the second signal.

5. The electronic pen according to claim 4,
wherein the signal transmission circuit includes a rectangular wave signal generation circuit which, in operation, generates a rectangular wave signal as the second signal.

6. The electronic pen according to claim 5, further comprising:
a transmission signal generation circuit,
wherein the signal transmission circuit includes a modulation circuit which, in operation, modulates the sine wave signal as the first signal according to a digital signal from the transmission signal generation circuit, and wherein the rectangular wave signal generation circuit, in operation, generates the rectangular wave signal as the second signal according to the digital signal from the transmission signal generation circuit.

7. The electronic pen according to claim 4, further comprising:
a first switch circuit which, in operation, is switched by the control circuit to connect the capacitor on the primary winding side with the resonance circuit when the sine wave signal is to be output, and to disconnect the capacitor on the primary winding side from the resonance circuit when the second signal is to be output,
wherein a first end of the primary winding is connected with a first end of the power supply circuit, and a second switch circuit is connected interposingly between a second end of the primary winding and a second end of the power supply circuit, and
the control circuit performs on-off control of the second switch circuit such that the second switch circuit is turned on at a zero-level point of the sine wave signal for a predetermined time period when the sine wave signal is to be output and turned off during other time periods and that the second switch circuit is caused to provide the power supply voltage for generating the second signal when the second signal is to be output.

8. The electronic pen according to claim 4,
wherein a first end of the primary winding is connected with a first end of the power supply circuit, and a switch circuit is connected interposingly between a second end of the primary winding and a second end of the power supply circuit, and
wherein the control circuit controls a length of a time period during which the switch circuit is turned on, such that the switch circuit is turned on at a zero-level point of the sine wave signal for a predetermined time period when the sine wave signal is to be output and turned off during other time periods and that the switch circuit enables the rectifier circuit to output a voltage constituting the power supply voltage for generating the second signal when the second signal is to be output.

9. The electronic pen according to claim 1,
wherein a frequency of the first signal is different than a frequency of the second signal, or an amplitude of the first signal is different than an amplitude of the second signal.

10. The electronic pen according to claim 1,
wherein each of the first signal and the second signal is modulated according to transmission information.

11. The electronic pen according to claim 1,
wherein the input reception circuit includes an operation part that is operable by a user.

12. The electronic pen according to claim 1,
wherein the power supply circuit includes a battery.

* * * * *